US008309936B2

United States Patent
Kreckel et al.

(10) Patent No.: US 8,309,936 B2
(45) Date of Patent: Nov. 13, 2012

(54) ION DEFLECTOR FOR TWO-DIMENSIONAL CONTROL OF ION BEAM CROSS SECTIONAL SPREAD

(75) Inventors: Holger Kreckel, Gemuenden (DE); Hjalmar Bruhns, Bonn (DE); Daniel Wolf Savin, New York, NY (US)

(73) Assignee: Trustees of Columbia University in the City of New York, New York City, NY (US)

( * ) Notice: Subject to any disclaimer, the term of this patent is extended or adjusted under 35 U.S.C. 154(b) by 138 days.

(21) Appl. No.: 12/708,886

(22) Filed: Feb. 19, 2010

(65) Prior Publication Data
US 2010/0219352 A1 Sep. 2, 2010

Related U.S. Application Data

(60) Provisional application No. 61/156,309, filed on Feb. 27, 2009, provisional application No. 61/234,888, filed on Aug. 18, 2009, provisional application No. 61/241,492, filed on Sep. 11, 2009.

(51) Int. Cl.
*H01J 3/34* (2006.01)
(52) U.S. Cl. .................................. 250/396 R
(58) Field of Classification Search .............. 250/281, 250/396 R, 291–292, 294–297; 313/439; 315/500–507; 976/DIG. 432–DIG. 434
See application file for complete search history.

(56) References Cited

U.S. PATENT DOCUMENTS

| 3,667,058 A | * | 5/1972 | Maschke | 315/507 |
| 3,770,337 A | * | 11/1973 | Merren | 250/282 |
| 4,058,724 A | * | 11/1977 | McKinney et al. | 250/307 |
| 4,418,280 A | * | 11/1983 | Matsuda | 250/296 |
| 4,588,955 A | * | 5/1986 | Anderson | 315/506 |
| 4,766,314 A | * | 8/1988 | Jung | 250/296 |
| 4,924,090 A | * | 5/1990 | Wollnik et al. | 250/296 |
| 5,357,107 A | * | 10/1994 | Ibach et al. | 250/305 |
| 6,104,029 A | * | 8/2000 | Coxon et al. | 250/305 |
| 7,372,042 B2 | * | 5/2008 | Mordehai et al. | 250/396 R |
| 7,858,950 B2 | * | 12/2010 | Dahl et al. | 250/396 R |

(Continued)

OTHER PUBLICATIONS

Benis, E.P., The hemispherical deflector analyser revisited II. Electron-optical properties, journal, Journal of Electron Spectroscopy, Nov. 2007, pp. 28-39, Elsevier Science, USA.

(Continued)

*Primary Examiner* — Robert Kim
*Assistant Examiner* — Wyatt Stoffa
(74) *Attorney, Agent, or Firm* — Evans & Molinelli PLLC; Eugene J. Molinelli

(57) ABSTRACT

An ion deflector, for deflecting a beam of charged particles along an arc in a deflection plane, includes a pair of non-spherical deflection electrodes adapted for being charged with different voltages. The pair of deflection electrodes are configured to control, in both the deflection plane and in a direction perpendicular to the deflection plane, a cross sectional spread of charged particles in a deflected beam that exits the ion deflector. In some embodiments, a first electrode has a first height perpendicular to the deflection plane and a second electrode has a different second height.

14 Claims, 12 Drawing Sheets

U.S. PATENT DOCUMENTS

| | | | |
|---|---|---|---|
| 2007/0045531 A1* | 3/2007 | Mordehai et al. | 250/285 |
| 2007/0075258 A1* | 4/2007 | Goto | 250/396 R |
| 2008/0290287 A1* | 11/2008 | David | 250/396 R |
| 2009/0121149 A1* | 5/2009 | Radovanov et al. | 250/396 R |
| 2010/0301227 A1* | 12/2010 | Muntean | 250/396 R |
| 2011/0049357 A1* | 3/2011 | Giles | 250/283 |

OTHER PUBLICATIONS

Hughes, A et al., On the Analysis of Electronic Velocities by Electrostatic Means, journal, Physical Review, Apr. 1929, vol. 34, pp. 284-290, vol. 34, St. Louis, Missouri.

Matsuda, Hisashi, Electrostatic Analyzser with Variable Focal Length, journal, The Review of Scientific Instruments, Jul. 1961, pp. 850-851, vol. 32, No. 7, Osaka, Japan.

Purcell, Edward, The Focusing of Charged Particles by a Spherical Condenser, journal, Physical Review, Nov. 1938, pp. 818-826, vol. 54, Cambridge, Massachusetts.

Zeman, H.D., Deflection of an ion bean in the two-dimensional electrostatic quadrupole field, journal, Nov. 1976, pp. 1079-1085, vol. 48, No. 8, Menlo Park, California.

Zouros, T.J.M. et al, The hemisperical deflector analyser revisited. I. Motion in the 1/r potential, generalized entry conditions, Kepler orbits and spectrometer basic equation, journal, Journal of Electron Spectroscopy, May 2002, pp. 221-248, Elsevier Science, USA.

* cited by examiner

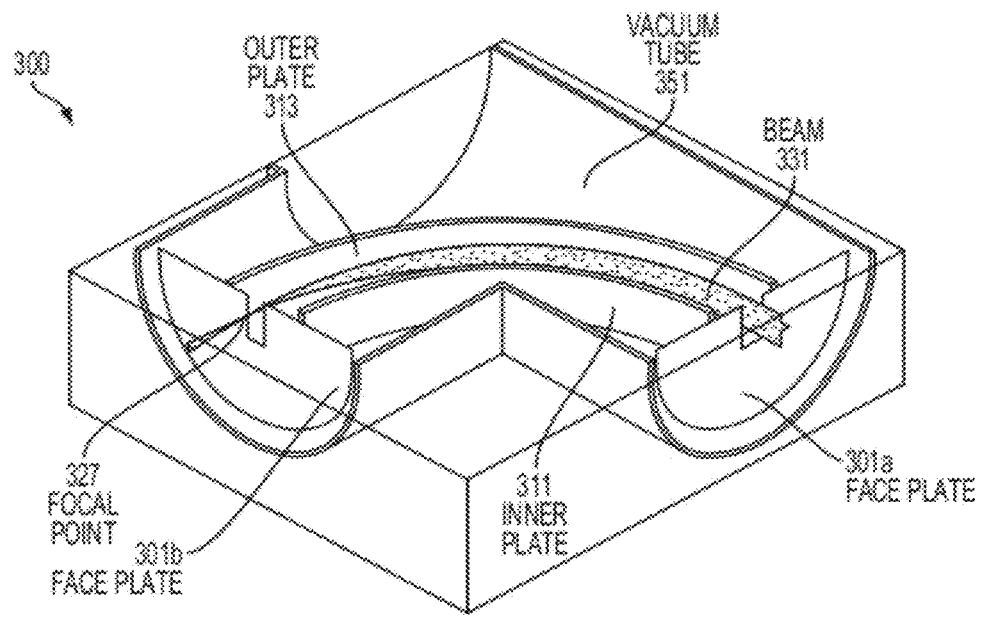
FIG. 3A
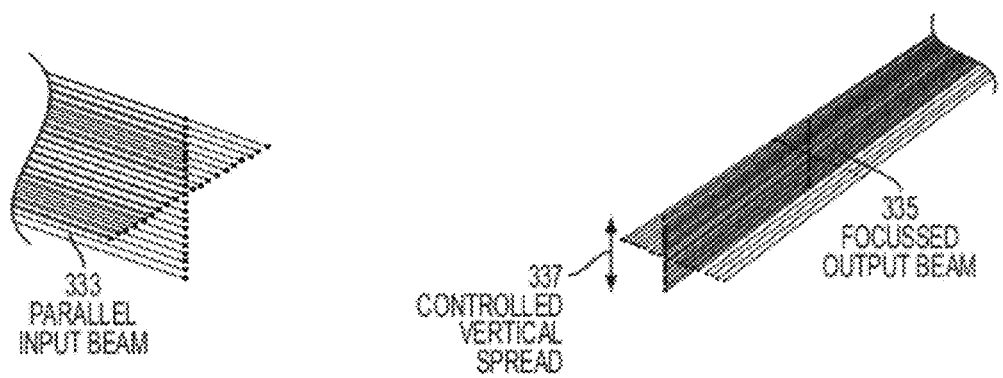
FIG. 3B
FIG. 3C

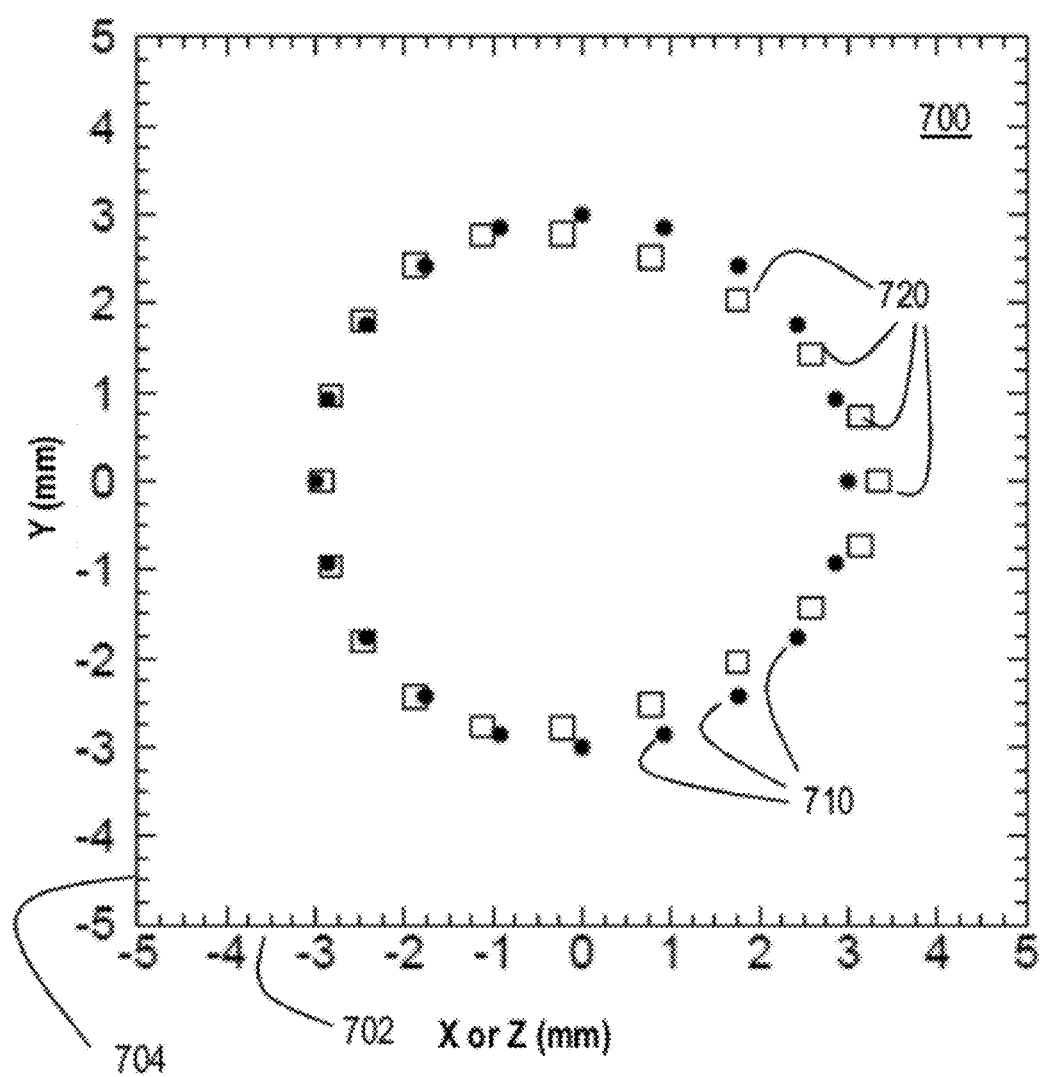

ION DEFLECTOR FOR TWO-DIMENSIONAL CONTROL OF ION BEAM CROSS SECTIONAL SPREAD

CROSS-REFERENCE TO RELATED APPLICATIONS

This application claims benefit of Provisional Appln. 61/156,309, filed Feb. 27, 2009, the entire contents of which are hereby incorporated by reference as if fully set forth herein, under 35 U.S.C. §119(e).

This application also claims benefit of Provisional Appln. 61/234,888, filed Aug. 18, 2009, the entire contents of which are hereby incorporated by reference as if fully set forth herein, under 35 U.S.C. §119(e).

This application further claims benefit of Provisional Appln. 61/241,492, filed Sep. 11, 2009, the entire contents of which are hereby incorporated by reference as if fully set forth herein, under 35 U.S.C. §119(e).

STATEMENT OF GOVERNMENTAL INTEREST

This invention was made with Government support under Grant Nos. CHE-0520660, AST-0606960, and AST-0807438 awarded by the National Science Foundation. The Government has certain rights in the invention.

BACKGROUND

Many devices used in commerce, such as mass spectrometers for material analysis and biotechnology analysis, involve ion beams. When working with ion beams in high-vacuum setups, several standard ion-optical elements are widely used to direct, store and focus ion beams. Among the standard ion-optical elements are quadrupole deflectors, cylindrical deflectors and spherical deflectors. These deflectors, among other ion optical elements are described in the book *Building Scientific Apparatus: A Practical Guide to Design and Construction* (Third Edition)—John H. Moore, Christopher C. Davis, and Michael A. Coplan, Perseus Books, Cambridge, Mass., 2003, ISBN 0-201-13187-0.

Cylindrical deflectors are easily built and operated. They use electrodes that consist of two curved metallic plates that form corresponding portions of concentric cylinders and are planted inside a vacuum chamber. A positive voltage +V is applied to one of the plates; and, the same voltage with opposite sign −V is applied to the other plate. A charged atom or molecule of the right kinetic energy entering the space between the plates and parallel to the plates at an entry port or aperture will follow the curvature of the plates and thus be guided along a defined beam arc to exit at an arbitrary deflection angle from its direction at the entry port. Other charged or uncharged atoms or molecules will not follow the defined arc and will be lost from the beam that exits the deflector at an exit port or aperture. The properties of the cylindrical deflector are such that it will focus an incoming parallel ion beam in the plane of the deflection while it does not have any influence on the momentum of the ions in the direction perpendicular to that plane. That means an incoming beam with a round cross section (a "round beam") will leave the deflector as a deflected beam with an oval cross section (an "oval beam"). In order to rectify the deformation of the cross section of the ion beam, asymmetrical lenses or other ion optical elements are used in concert with the cylindrical deflector.

A quadrupole deflector (called simply a quadrupole) consists of four parallel rods, forming two pairs of opposing rods, perpendicular to the plane of deflection. By applying appropriate voltages to these pairs of opposing rods, an incoming ion beam can be deflected by an arbitrary angle. Like the cylindrical deflector, a quadrupole focuses in the plane of deflection while it leaves the beam unfocused in the perpendicular direction. Hence, usually quadrupoles are also used with corrective electrodes or ion lenses along with additional power supplies at the entrance and exit to correct for the distortion of the transmitted beam cross section shape. Much higher voltages (e.g., +/−9800 volts) are required in quadrupoles compared to cylindrical deflectors (e.g., +/−2300 volts) to deflect the same ion beam (e.g., having an energy of 10 thousand electron Volts, keV) by an angle of 90 degrees.

Spherical deflectors are more complicated to build. They use electrodes that consist of portions of two nested spheres with different radii. Again, two voltages of opposite sign are applied and ions can be guided between the electrodes. Unlike the cylindrical deflector or the quadrupole, a spherical deflector creates a focus in both directions. That means a beam entering the structure with a round cross section will retain a round cross section upon exiting the deflector.

SOME EXAMPLE EMBODIMENTS

Therefore, there is a need for an ion beam deflector that controls cross section shape of an ion beam in both directions, without the structural complexity of nested spherical electrodes in a spherical deflector and without the high voltages required in a quadrupole or correction electrodes (along with additional power supplies) at the entrance and exit required in quadrupole and conventional cylindrical deflectors.

According to a first set of embodiments, an ion deflector for deflecting a beam of charged particles along an arc in a deflection plane includes a pair of non-spherical deflection electrodes adapted for being charged with different voltages. The pair of deflection electrodes are configured to control, in both the deflection plane and in a direction perpendicular to the deflection plane, a cross sectional spread of charged particles in a deflected beam that exits the ion deflector.

According to another set of embodiments, an apparatus includes a means for charging a pair of non-spherical deflection electrodes with different voltages to deflect, along an arc in a deflection plane, an incident beam of charged particles that enters the apparatus. The apparatus also includes a means for controlling, in both the deflection plane and in a direction perpendicular to the deflection plane, a cross sectional spread of charged particles in a deflected beam that exits the apparatus based on the different voltages and the incident beam that enters the apparatus.

According to another set of embodiments, an apparatus includes a vacuum chamber portion, a first cylindrical plate and a second cylindrical plate. The first cylindrical plate has a first radius of curvature in a deflection plane and a first height perpendicular to the deflection plane. The second cylindrical plate has a different second radius of curvature in the deflection plane and a different second height perpendicular to the deflection plane. The first cylindrical plate is disposed inside the vacuum chamber portion; and the second cylindrical plate is disposed inside the vacuum chamber portion and displaced from the first cylindrical plate in the deflection plane. The first cylindrical plate and second cylindrical plate are configured to hold different voltages sufficient to deflect an ion beam in the deflection plane According to another set of embodiments, a method of operating an apparatus includes applying different voltages to a first cylindrical plate and a second cylindrical plate of the apparatus. The apparatus includes a vacuum chamber portion, the first cylindrical plate and the second cylindrical plate. The first cylindrical plate has a first radius of curvature in a deflection plane and a first height. The second cylindrical plate has a different second radius of curvature in the deflection plane and a different second height. The first cylindrical plate is disposed inside the vacuum chamber portion and the second cylindrical plate is disposed inside the vacuum chamber portion and displaced from the first cylindrical plate in the deflection plane. The different voltages applied to the cylindrical plates are sufficient to deflect an ion beam in the deflection plane and to focus the ion beam both in the deflection plane and in a plane perpendicular to the deflection plane after the ion beam is deflected.

Still other aspects, features, and advantages of the invention are readily apparent from the following detailed description, simply by illustrating a number of particular embodiments and implementations, including the best mode contemplated for carrying out the invention. The invention is also capable of other and different embodiments, and its several details can be modified in various obvious respects, all without departing from the spirit and scope of the invention. Accordingly, the drawings and description are to be regarded as illustrative in nature, and not as restrictive.

BRIEF DESCRIPTION OF THE DRAWINGS

The embodiments of the invention are illustrated by way of example, and not by way of limitation, in the figures of the accompanying drawings:

FIG. 3A is a diagram that illustrates a simulation of example operation of a double focusing cylindrical deflector, according to an embodiment;

FIG. 3B is a diagram that illustrates a simulation of example major and minor axes of a cross section of a parallel circular input ion beam, according to an embodiment;

FIG. 3C is a diagram that illustrates a simulation of example major and minor axes of a cross section of a focused output ion beam, according to an embodiment;

FIG. 7 is a graph that illustrates ion beam cross section shape differences between input and output ion beams of an ion deflector, according to an embodiment;

DETAILED DESCRIPTION OF EXAMPLE EMBODIMENTS

An apparatus and method for ion beam deflection is disclosed. In the following description, for the purposes of explanation, numerous specific details are set forth in order to provide a thorough understanding of the embodiments of the invention. It is apparent, however, to one skilled in the art that the embodiments of the invention may be practiced without these specific details or with an equivalent arrangement. In other instances, well-known structures and devices are shown in block diagram form in order to avoid unnecessarily obscuring the embodiments of the invention.

Although several embodiments of the invention are described in the context of electrodes that are featureless circular cylindrical plates with a constant radius of curvature along the plate and a shorter inner plate height for deflections of 90 degrees, it is explicitly contemplated that in other embodiments one or more electrodes may have a varying radius of curvature or the outer electrode may be shorter than the inner electrode, or other features may be introduced on one or more electrodes, such as a exit port for uncharged atoms or molecules, or an along-path variation in a difference between heights of inner and outer electrodes, or one or more angled extensions added to either or both electrodes for further control of both dimensions of a beam's cross sectional shape, for deflections of the same 90 degree angle or for larger or smaller angles, or any combination thereof.

Figure 1A:
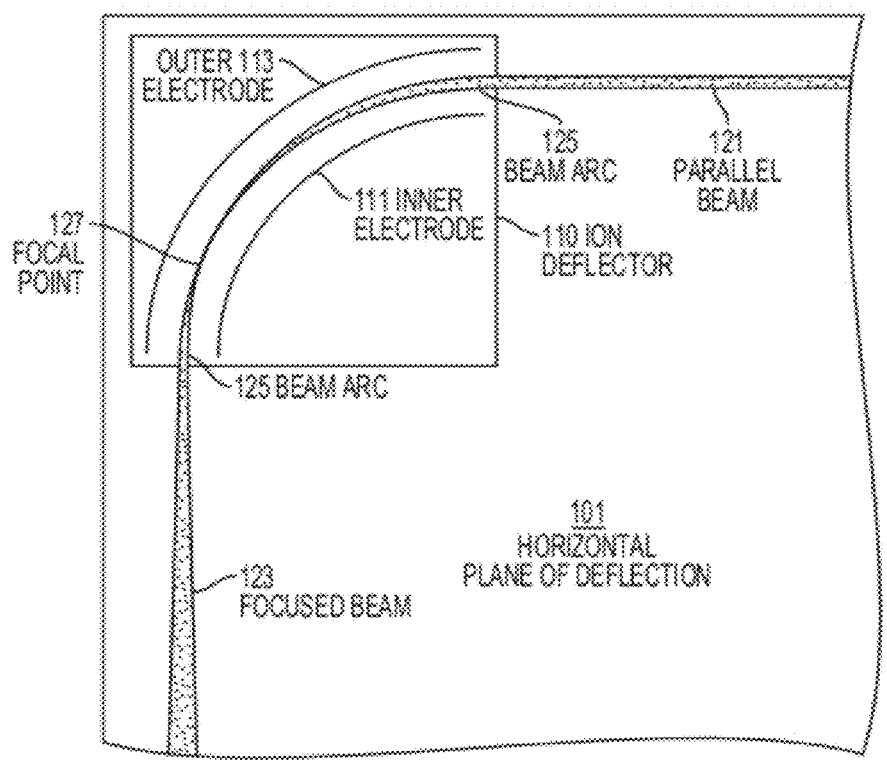
FIG. 1A is a diagram that illustrates a simulation of an example system deflecting an ion beam, according to one embodiment.

FIG. 1A is a diagram that illustrates a simulation of an example system deflecting an ion beam, according to one embodiment. The simulated beam properties in FIG. 1A and subsequent diagrams are computed using standard beam tracing software based on Maxwell's equations, well known in the art, and accurately predict beam cross sectional and focusing features. The system includes ion deflector 110 for deflecting an ion beam (e.g., parallel beam 121) along an arc in a plane of deflection 101. The plane of deflection 101 is called a "horizontal" plane hereinafter for convenience only, to help distinguish it from other perpendicular directions and planes (called "vertical" hereinafter), and not to limit plane of deflection 101 to a plane parallel to the horizon of the Earth or otherwise horizontal in the perspective of a particular observer.

The illustrated ion deflector includes two electrodes, an inner electrode 111 and an approximately parallel outer electrode 113, that intersect the horizontal plane 101 in two arcs depicted in FIG. 1A. The arc in the horizontal plane approximately midway between the two electrodes followed by an ion beam to be deflected is called herein a beam arc 125. The inner electrode 111 is charged to attract ions in an ion beam to be deflected and the outer electrode 113 is charged to repel those ions. An ion beam (e.g., parallel beam 121) of charged atoms or molecules enters the ion deflector 110 between the inner electrode 111 and outer electrode 113 at an angle that is approximately parallel to the tangents to the electrodes at the point of entry. An ion beam of a certain kinetic energy approximately follows the curvature of the parallel inner electrode 111 and outer electrode 113 to remain between them on beam arc 125 and exit the ion deflector as a deflected ion beam (e.g., focused beam 123). The ions in the focused beam converge in the horizontal plane 101 to a focal point 127 and diverge in the horizontal plane 101 beyond that focal point 127. Although the focal point 127 is shown inside the ion deflector 110 for purposes of illustration, in various other embodiments, the focal point is at an exit point of the ion deflector 110 or outside the ion deflector 110. Like an optical lens, the ion deflector 110 is symmetric, in that an ion beam can enter at either end of the beam arc 125 and exit the other end. The position of the focal point is reflected about the midpoint of the beam arc 125 for a parallel beam entering at the opposite end of ion deflector 110 compared to the entry of parallel beam 121.

In some embodiments, the incident ion beam (e.g., focused beam 123) entering the ion deflector 110 is focused at the focal point of the ion deflector (e.g., focal point 127) and leaves the ion deflector 110 as a parallel beam (e.g., parallel beam 121). This behavior is also analogous to an optical lens.

In conventional cylindrical deflectors, the inner electrode 111 and the outer electrode 113 are curved plates that have the same height (not shown) in the vertical direction perpendicular to the plane of deflection 101, and are aligned vertically. Furthermore, in conventional cylindrical deflectors, each of the inner electrode 111 and the outer electrode 113 are circular arcs with a constant radius of curvature, and both arcs share the same center (are "concentric") in the plane of deflection 101.

As described above, a disadvantage of conventional cylindrical deflectors is that they do not provide control over the vertical spread of the ion beam, i.e., the spread of the ion beam cross section in a direction perpendicular to the plane of deflection 101. This is illustrated in FIG. 1B and FIG. 1C.

Figure 1B:
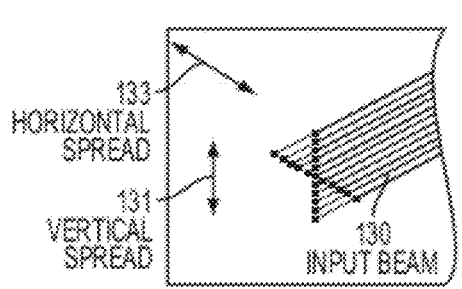
FIG. 1B is a diagram that illustrates a simulation of example major and minor axes of a cross section of an input ion beam, according to an embodiment.

FIG. 1B is a diagram that illustrates a simulation of example major and minor axes of a cross section of an input ion beam 130, according to an embodiment. The vertical spread 131 indicates one axis of the cross section of the ion beam and the horizontal spread 133 indicates the perpendicular axis. It is assumed for purposes of illustration that the vertical spread 131 is equal to the horizontal spread 133. The major axis is the longest axis of a cross section; and, because the two axes are equal, either may serve as the major axis and the other as the minor axis of the cross section. Other cross sections may have the same vertical spread and horizontal spread, such as a beam with a circular cross section, a beam with a square cross section or a beam made by a cross of two perpendicular linear sections of equal length, as depicted in FIG. 1B. For simplicity, all these beams are called circular beams.

Figure 1C:
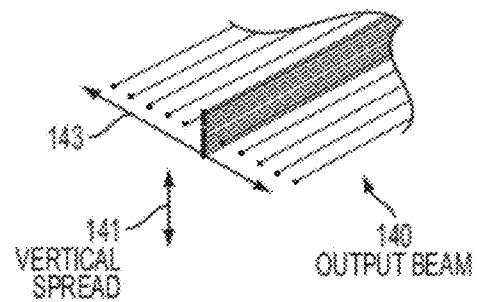
FIG. 1C is a diagram that illustrates a simulation of example major and minor axes of a cross section of an output ion beam, for a conventional cylindrical deflector.

FIG. 1C is a diagram that illustrates a simulation of example major and minor axes of a cross section of an output ion beam 140, for a conventional cylindrical deflector. The vertical spread 141 indicates one axis of the cross section of the ion beam and the horizontal spread 143 indicates the perpendicular axis. Here the horizontal spread 143 is significantly greater than the vertical spread and is the major axis of the cross section. The vertical spread is the minor axis of the cross section. Other cross sections may have different vertical spread and horizontal spread, such as a beam with an elliptical cross section, a beam with a rectangular cross section or a beam made by a cross of two perpendicular linear sections of different length, as depicted in FIG. 1C. For simplicity, all these beams are called oval beams.

When a conventional cylindrical ion deflector is used on a parallel beam with a circular cross section, as shown in FIG. 1B, the beam is focused in the horizontal plane only and not in the vertical. Beyond the focal point 127 the horizontal spread increases but the vertical spread remains unchanged. The cross section uncontrollably becomes oval as depicted in FIG. 1C. Thus the beam fails to retain its cross sectional shape in a conventional cylindrical deflector.

In an example simulated embodiment of a conventional cylindrical deflector, the input beam is a parallel beam of ions with a vertical spread of 5 millimeters (mm, 1 mm=$10^{-3}$ meters) and a horizontal spread of 5 mm. The simulations were for a beam of hydrogen ions (with an extra electron) designated H- at an energy of 10 thousand electron Volts (kilo-electron Volts, keV, 1 keV=$10^3$ electron Volts). So the mass of each ion is that of hydrogen plus a second electron minus the electron affinity, about $1.67\times10^{-24}$ grams. The charge is −1e, where e is the fundamental charge. The same deflection is effected in any input ion beam that had been accelerated to 10 keV. The outer surface of the inner plate has a constant radius of curvature of 120 mm and the inner surface of the outer plate has a constant radius of curvature of 150 mm. The inner plate is charged to +2300 volts (V) and the outer plate is charged to −2300 V. Both are the same height so that the applied electric field is purely horizontal. The horizontal spread is focused and the beam emerges from the focal point with an expanding horizontal spread indicated by a horizontal angular range (called a full "azimuth" range) of 2.5 degrees. However the vertical spread is unfocused and is spreading in a ballistic fashion, unaffected by the deflector. In the simulated beam the vertical ballistic spread is essentially constant, with a vertical angular range (called a full "elevation" range) of only 0.1 degrees. As a result, there is controlled spreading in the horizontal and no controlled spreading in the vertical, leading to the oval output beam 140.

Figure 1D:
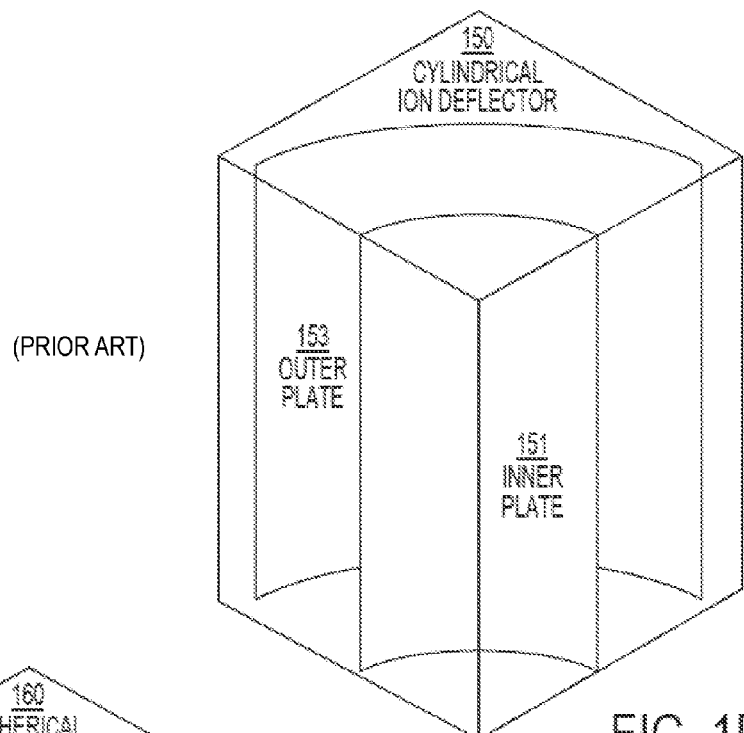
FIG. 1D is a diagram that illustrates an example cylindrical ion deflector.

FIG. 1D is a diagram that illustrates an example cylindrical ion deflector 150 with equal vertical height for the inner plate 151 and the outer plate 153. The plates are corresponding portions of two concentric circular cylinders. This is like a conventional cylindrical ion deflector and does not provide control of the vertical spread. For ion deflector 150, the input beam 130 uncontrollably becomes output beam 140.

For many applications, it is desirable to retain the cross sectional shape of an ion beam, or at least control the vertical spread as well as controlling the horizontal spread.

Figure 1E:
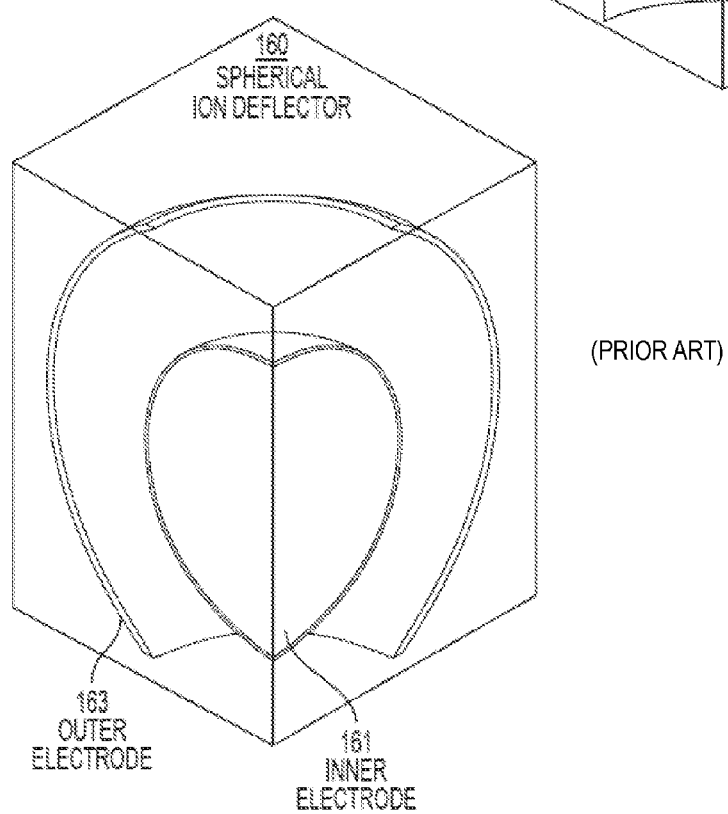
FIG. 1E is a diagram that illustrates an example spherical ion deflector.

FIG. 1E is a diagram that illustrates an example spherical ion deflector 160 that includes inner electrode 161 and outer electrode 163. The electrodes are corresponding portions of two concentric spheres. This is like a conventional spherical ion deflector which provides control of the vertical spread. For spherical ion deflector 160, the circular input beam 130 remains circular and does not become an oval beam as the beam converges at the focal point and then diverges beyond. However, as indicated in the background, a spherical ion deflector is expensive to produce. It is estimated that the cost for a spherical deflector in 2008 is about $15,000. A quadrupole deflector with ancillary devices to correct for vertical spread and thus providing similar function is sold for about $10,000.

Non-Spherical Double Focusing Electrodes.

According to various embodiments of the invention, one or more non-spherical electrodes are used in an ion deflector to provide control of vertical spread. For example, in various embodiments an angled extension is added above or below (or both) to one or more of the charged electrodes to inflict a vertical component to the electric field at the location of at least one or more portions of the beam arc. In one set of embodiments, cylindrical plates of different heights are used for the inner and outer electrodes. In various embodiments of this set, the cylindrical plates are corresponding portions of two cylinders that are circular with constant radius of curvature or not and are concentric or not, in any combination. In some embodiments each plate is constant in height perpendicular to the plane of deflection 101 throughout the ion deflector 101; while, in other embodiments, the height varies with position in the ion deflector.

Figure 1F:
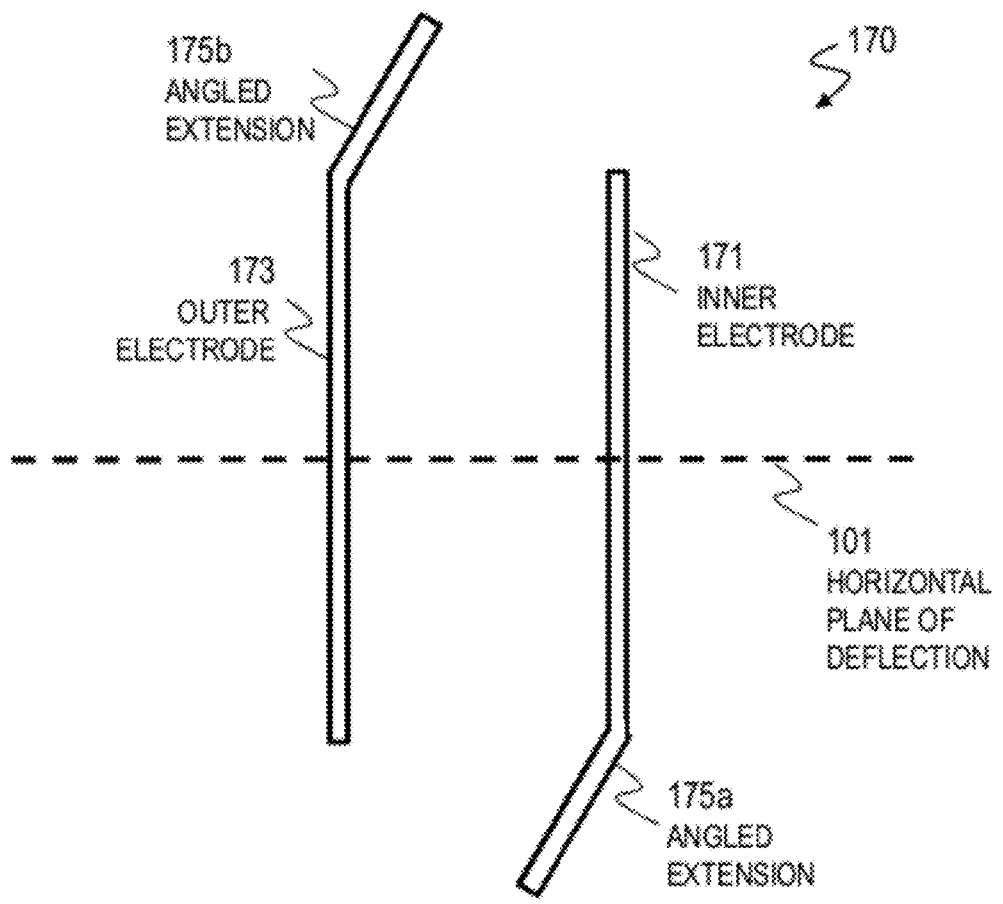
FIG. 1F is a diagram that illustrates an example vertical cross section through a non-spherical ion deflector, according to an embodiment.

FIG. 1F is a diagram that illustrates an example vertical cross section through a non-spherical ion deflector 170, according to an embodiment. The horizontal plane of deflection 101 is indicated by the dashed line. The non-spherical ion deflector 170 includes an inner electrode 171 with an angled extension 175a and an outer electrode 173 with an angled extension 175b. The purpose of angled extension 175a and angled extension 175b is to provide a vertical component of the electric field between the inner electrode 171 and the outer electrode 173 when the electrodes are charged. In some embodiments, a different number of angled extensions are on each electrode.

In a particular embodiment that was both simulated and used experimentally, portions of concentric circular cylinder plates are used as electrodes in which the height of the outer plate is greater than a height of the inner plate, and each plate maintains a constant height within the ion deflector. Such embodiments are called double-focusing cylindrical deflectors.

Figure 2A:
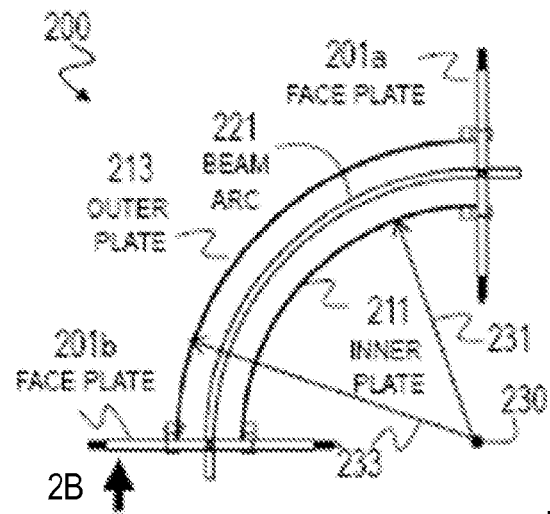
FIG. 2A is plan view that illustrates example components of a double-focusing cylindrical ion deflector, according to one embodiment.

FIG. 2A is a plan view that illustrates example components of a first experimental double-focusing cylindrical deflector 200, according to one embodiment. The double-focusing cylindrical deflector 200 includes a first face plate 201a, a second face plate 201b, a cylindrical inner plate 211 and a cylindrical outer plate 213. A beam arc 221 lies midway between the cylindrical plates 211 and 213 in the horizontal plane of deflection 101. The beam arc 221 connects an input/output aperture (not shown) on the first face plate 201a with an input/output aperture (not shown) on the second face plate 201b. The inner plate 211 and outer plate 213 are concentric with a center of curvature 230. The inner plate 211 has a smaller inner radius of curvature 231 than the outer plate 213, which has an outer radius of curvature 233. The direction of view of these components in FIG. 2B is indicated by the arrow labeled "2B."

Figure 2B:
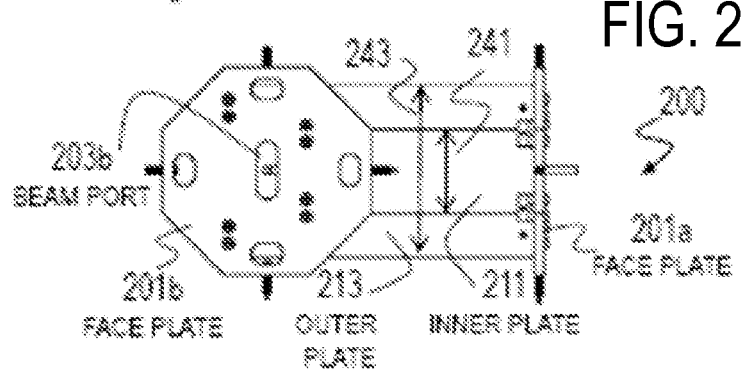
FIG. 2B is an elevation view that illustrates the example components of the double-focusing cylindrical ion deflector depicted in FIG. 2A, according to one embodiment.

FIG. 2B is an elevation view that illustrates the example components of the double-focusing cylindrical ion deflector 200 depicted in FIG. 2A, according to one embodiment. The first face plate 201a, second face plate 201b, inner plate 211 and outer plate 213 are as described above for FIG. 2A. Also depicted in FIG. 2B is the input/output aperture 203b in face plate 201b. The inner height 241 of the inner plate 211 in the vertical direction perpendicular to the plane of deflection 101 is shown along with the outer height 243 of the outer plate 213 in the vertical direction. Clearly, the outer height 143 is greater than the inner height 141. In one embodiment, the outer height 143 is about double the inner height 141 and the distance between the inner plate and the outer plate is about the same as the height 241 of the inner plate.

Figure 2C:
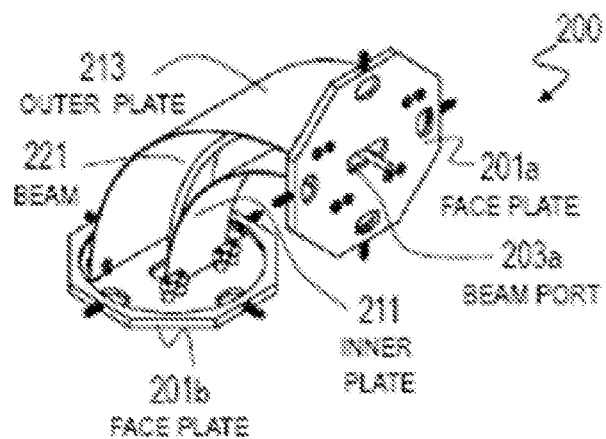
FIG. 2C is a perspective view that illustrates the example components of the double-focusing cylindrical ion deflector depicted in FIG. 2A, according to one embodiment.

FIG. 2C is a perspective view that illustrates the example components of the double-focusing cylindrical ion deflector 200 depicted in FIG. 2A, according to one embodiment. The first face plate 201a, second face plate 201b, inner plate 211 and outer plate 213 are as described above for FIG. 2A. Also depicted in FIG. 2B is the input/output aperture 203a in face plate 201a.

In a particular embodiment, the height 241 of the inner plate is 2 inches and the height 243 of the outer plate is about 4 inches. In this embodiment, the double-focusing deflector 200 is made of stainless steel and Peek screws and embedded in stainless steel vacuum tubes. Peek is a plastic with good vacuum properties which is commercially available. None of these materials is hazardous. Also in this embodiment, the inner radius of curvature 231 is about 5.5 inches and the outer radius of curvature 233 is about 7 inches, so that the distance between the plates is about 1.5 inches. The vacuum tubes represent a portion of a vacuum chamber that is constructed by bolting several vacuum chamber portions together until no open ends remain, as is well known in the art.

In the illustrated embodiment, in the plane of deflection 101, the electrical fields exert the same force on the ions as in the ordinary cylindrical deflector. However, in the vertical direction perpendicular to that plane, the depicted structure has focusing properties due to the inhomogeneity of the electric fields caused by the height difference of the plates 211 and 213, as shown in more detail below with reference to FIG. 6A. Hence, the double-focusing cylindrical deflector 200 can be used to replace a spherical deflector 160; and at the same time, the double-focusing cylindrical deflector 200 is much easier and more cost-effective to manufacture and install. For example, the cost for the double-focusing cylindrical deflector (without vacuum chamber which costs around $800) is about $300 for material and less than one man-workday in a mechanical shop. This is significantly less expensive than both the estimated cost ($15,000) to construct a spherical deflector and the cost ($10,000) to obtain a quadrupole with corrective components to perform the same function.

FIG. 3A is a diagram that illustrates a simulation of example operation of a double focusing cylindrical deflector 300, according to one embodiment. The double focusing cylindrical deflector 300 includes a face plate 301a and a face plate 301b, collectively referenced hereinafter as face plates 301, which are attached to a vacuum tube 351 that is a portion of a vacuum chamber. Inside the vacuum tube 351 are a cylindrical inner plate 311 and a taller cylindrical outer plate 313. An ion beam 331 entering the deflector 300 is focused in the vertical direction and horizontal direction at focal point 327 while traversing the beam arc.

FIG. 3B is a diagram that illustrates a simulation of example major and minor axes of a cross section of a parallel circular input ion beam 333, according to an embodiment. FIG. 3C is a diagram that illustrates a simulation of example major and minor axes of a cross section of a focused output ion beam 335, according to an embodiment. The controlled vertical spread 337 is matched to the horizontal spread so that the focused output beam remains circular as the beam diverges beyond the focal point 327. In some embodiments a focal point for the output beam in the horizontal plane is in a different position along beam path than a focal point for the output beam in the vertical plane, as described in more detail in the next section.

Figure 3D:
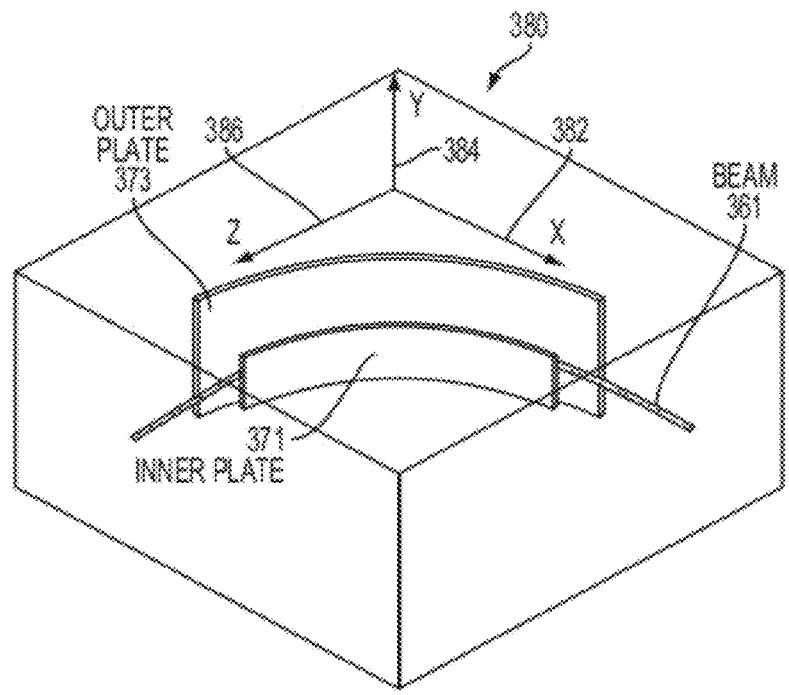
FIG. 3D is a diagram that illustrates a coordinate system for simulation of example ion beam trajectories and cross sections based on electrode plates of different heights, according to various embodiments.

FIG. 3D is a diagram that illustrates a coordinate system 380 for simulation of example ion beam trajectories and cross sections based on electrode plates of different heights, according to various embodiments. The plane of beam deflection, called the deflection plane or horizontal plane, is defined by the X axis 382 and Z axis 386 which are perpendicular to each other. X values decrease in the direction of an input beam, while Z values increase in the direction of an output beam. The origin, where the X axis and Z axis intersect, is outside an outer plate so that points along the beam always have positive X values and positive Z values. The Y axis is perpendicular to the X-Z plane at the origin and a plate's extent in the Y dimension is the plate's height. A plane parallel to Y axis 384 is said to be a perpendicular plane; and is also called a vertical plane.

Depicted relative to the simulation coordinate system is an example beam 361, an example inner plate 371 and an example outer plate 373. The midpoint of the beam 361 in the vertical direction is at Y=0.

Figure 3E:
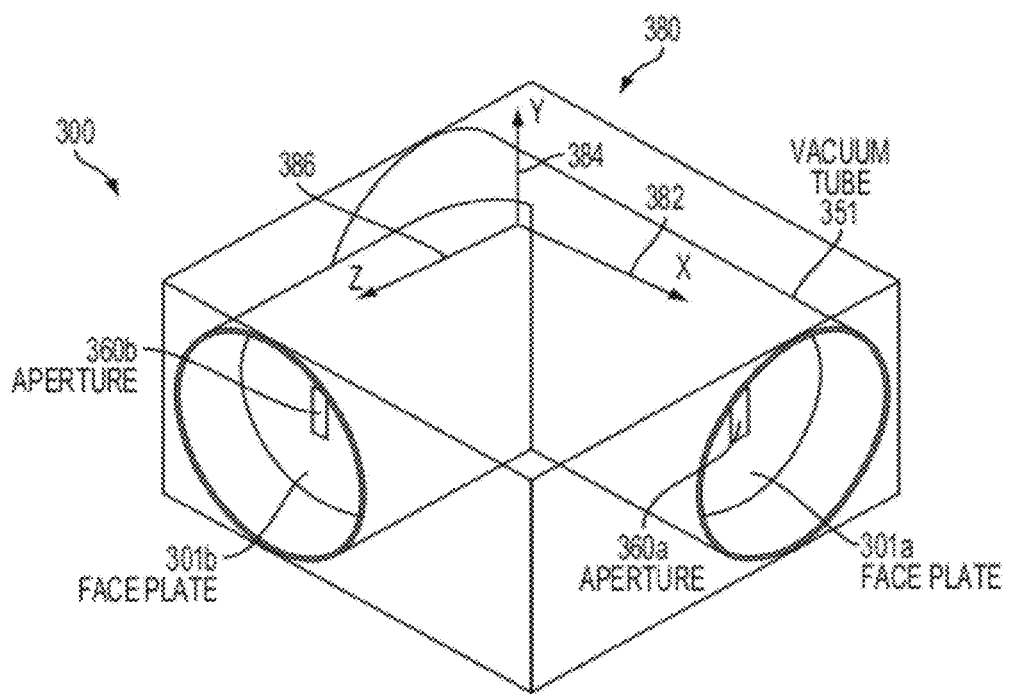
FIG. 3E is a diagram that illustrates vacuum tube and face plates in the coordinate system of FIG. 3D, according to various embodiments.

FIG. 3E is a diagram that illustrates vacuum tube 351 and face plates 301 in the coordinate system 380 of FIG. 3D, according to various embodiments. Each face plate 301 has a corresponding aperture to allow a beam to pass through the face plate 301. Face plate 301a includes aperture 360a, which can serve as an input or output beam aperture in various embodiments; and face plate 301b includes aperture 360b, which can serve as an output or input beam aperture in corresponding embodiments.

The following theoretical considerations are provided to help explain certain embodiments. However, embodiments are not limited by the completeness or accuracy of these theoretical considerations.

The potential difference that is necessary to guide an ion with energy Ubeam on a center radius, designated R0 (e.g., along ion beam arc 221), between the cylindrical plates can be calculated by equating the electrostatic force and the centrifugal force, as given by Equation 1.

$$qE = mv^2/R0 \tag{1}$$

where E is the electric field strength in volts per meter, v is the velocity of the particle in meters per second, m the mass of the particle, and q is the electrical charge of the particle. R0 is the center radius in meters. The kinetic energy Ubeam of the particle is defined by Equation 2.

$$U\text{beam} = mv^2/2 \tag{2}$$

Substituting Equation 2 into Equation 1 and expressing energy of Ubeam in electron volts yields Equation 3.

$$E = 2\, U\text{beam}/R0 \tag{3}$$

For the simulated negative ion beams of 10 keV energy, and for R0=159 mm, the computed field strength is about 125.8 kV/m, resulting in an electrical potential (voltage) difference of about 4780 V between the two cylindrical plates which are about 38 mm apart. In reality, the incoming particles experience a smooth transition, from an infinite radius to R0 and back, upon entrance and exit of the deflector. Depending on the aperture design, the potential values can vary slightly, as shown below. In the simulated embodiments shown below, electrical potentials (voltages) of about +/−2420 V were applied to the inner and outer plates, respectively, giving a potential voltage difference between the plates of 4840 V. The face plates are at ground (electrical potential=0).

In the deflection plane, the ion beam experiences a focusing force that results in a narrow beam waist (called a focus point hereinafter) after a deflection angle of about 65 degrees. For an ideal cylindrical analyzer, one would expect the focus to occur after about 63.5 degrees, since re-focusing of a spot-sized incoming beam occurs at a deflection angle given by $\pi/\sqrt{2}=127$ degrees. The discrepancy in focus location is expected to be due to geometry details, such as the size and shape of the apertures, and the precision of the plate heights and curvatures.

Separate Control of Horizontal and Vertical Focus by Electrode Height Differences.

In some embodiments separate control of horizontal and vertical focus is provided by varying the ratio of electrode heights of two cylindrical plate electrodes.

Figure 4:
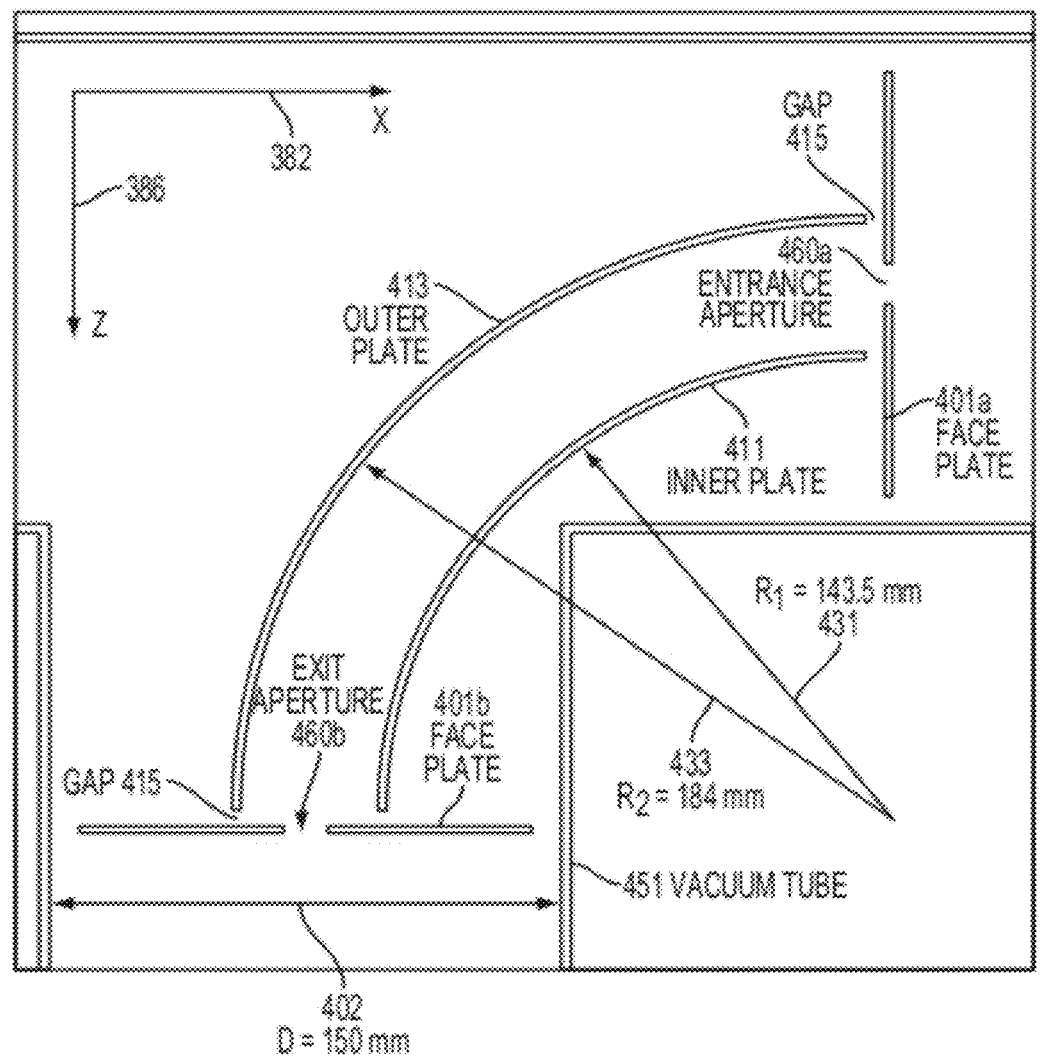
FIG. 4 is a diagram that illustrates a horizontal (X-Z plane) cross-section of an ion deflector for simulating different plate height ratios, according to an embodiment.

FIG. 4 is a diagram that illustrates a horizontal (X-Z plane) cross-section of an ion deflector for simulating different plate height ratios, according to an embodiment. X axis 382 and Z axis 386 are as in previous diagrams. Various ion deflector embodiments in a set of simulated ion deflector embodiments have the features depicted in FIG. 4, including a vacuum tube 451 forming a portion of a vacuum chamber; and a first face plate 401a and second face plate 401b, collectively referenced hereinafter as face plates 401. The face plates are maintained at electrical ground (zero voltage). The face plates 401a and 401b include aperture 460a and aperture 460b, respectively, collectively referenced hereinafter as apertures 460. In the illustrated embodiment, aperture 460a is an entrance aperture for an input beam and aperture 460b is an exit aperture for an output beam.

The inner plate 411 and outer plate 413 are concentric cylindrical plates. The radius of curvature for the inner plate 411 is depicted as R1 431 and is equal to 143.5 mm in this set of embodiments. The radius of curvature for the outer plate 413 is depicted as R2 433 and is equal to 184 mm in this set of embodiments. The height of the inner electrode was adjusted for different embodiments of this set, while the outer electrode was held fixed at a constant height of 101 mm. These electrodes are placed within a tee shaped vacuum tube 451 constructed of cylinders with horizontal axes, which are electrically grounded. The vacuum chamber cylinders have an inner diameter D 402 of 150 mm. When placed within the vacuum tubes 451, the mid-point between the plates was offset radially inwards by 1.5 mm from the Z coordinate of the mid-point of the entrance face plate 401a and the X coordinate of the midpoint of the exit faceplate 401b. The ends of the electrode plates are 5.5 mm from the inner face of the entrance and exit face plates 401, as depicted by gaps 415, to electrically isolate the plates 401, 411 and 413.

Beam trajectories and cross sectional shapes were modeled using SIMION software from SCIENTIFIC INSTRUMENT SERVICES™ of Ringoes, N.J. SIMION is a software package primarily used to calculate electric fields and the trajectories of charged particles in those fields when given a configuration of electrodes with voltages and particle initial conditions, including optional radio frequency (quasistatic) voltages and magnetic field, and with collision effects. In this, SIMION provides extensive supporting functionality in geometry definition, user programming, data recording, and visualization. It is an affordable but versatile platform, widely used for over 25 years to simulate lens, mass spectrometry, and other types of particle optics systems.

To allow SIMION to use integer plate heights for computational efficiency and stability, and still resolve focus points to sufficient accuracy for purposes of this demonstration, the 101 mm height of outer plate 413 was converted to 384 arbitrary height units. The simulated particle beam 361 consists of H⁻ ions, with a charge of −e, a mass of 1.008 amu, and energy of 10 keV. In the deflection plane, an ion beam includes a line of 21 ions, equally spaced between Z coordinates of 80 mm to 90 mm axis, and centered on the midpoint of the entrance aperture 360a, which lies at Y coordinate of 0 mm and Z coordinate of 85 mm. In the perpendicular plane, an ion beam also includes a line of 21 ions, equally spaced between Y coordinates of −5 mm to 5 mm, again centered on the midpoint of the entrance aperture 360a. The central ray is defined as the ion trajectory starting on the horizontal and vertical midpoints of the entrance aperture. The initial velocity vector for all ions was parallel to the X axis.

Symmetric voltages were determined to deflect the central ion trajectory by 90° from where it entered the deflector. A voltage of +V was applied to the inner plate 411 and of −V to the outer plate 413. To evaluate if the beam turned 90°, the entrance and exit locations on the workspace were observed; if a particle entered the workspace at a Z coordinate of 85 mm, after a 90° turn it should exit the workspace at an X coordinate of 85 mm.

The appropriate deflection voltages versus plate height ratio are listed in Table 1, below. Simulation results depicted in Table 1 are based on rectangular entrance and exit apertures, each of 13 mm in the deflection plane and 34 mm in a perpendicular plane. It is found that by changing the relative heights of the two plates, the distances between the positions of the deflection and perpendicular focus points can be controlled. The plate ratio is given by $h_1:h_2$, where $h_1$ is height of the inner plate in arbitrary units and $h_2$ is the height of the outer plate in arbitrary units, to express the height ratio as a ratio of whole numbers. The aspect ratio of the beam cross sections also vary with height ratio. The aspect ratio (height/width) of the cross section of the input beam entering entrance aperture 460a was 1 in these simulations. The output cross section height and width of the output ion beam were measured about 400 mm beyond the exit aperture 460b (e.g., at a Z coordinate about 650 mm).

Table 1 repeats, and other variables in the table also remain the same. This repetition occurs even though the plate ratio is different and the height of the inner plate in the geometry code of the simulation has been adjusted accordingly. The data reveals that this simulation was able to resolve differences of only 0.5 mm. Due to mirroring in the vertical direction (along Y axis), plate heights were only able to be resolved to within about 1 mm. However, even at 1 mm resolution, the effects of plate height ratio on focus point position can be demonstrated. Greater resolution can be simulated by modeling with more powerful computational resources.

Figure 5:
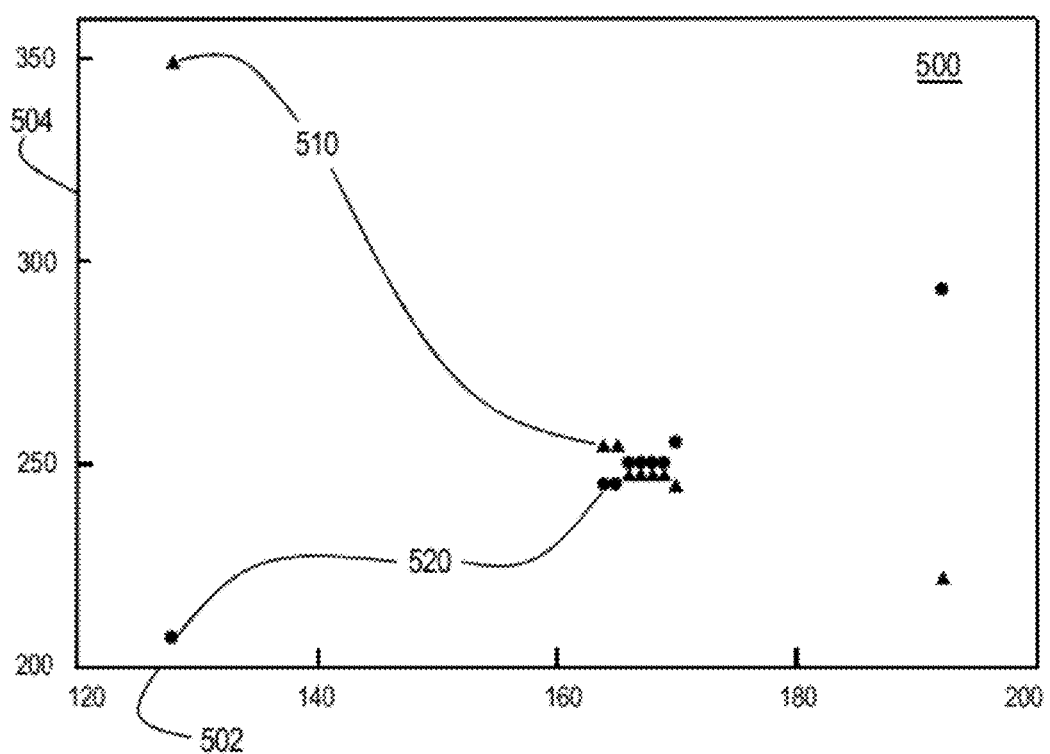
FIG. 5 is a graph that illustrates dependence of beam focus position on electrode plate height ratio, according to various embodiments.

As shown in Table 1 and FIG. 5, the deflection plane and perpendicular plane focus points lie closest together for plate ratios ranging from about 166:384 to about 169:384. The simulations imply that the focus points would merge somewhere between a ratio of 165:384 and a ratio of 166:384, where 384 corresponds to 101 mm. It appears that this merging would occur at a location just inside the exit aperture, which is located at a Z coordinate of 255 mm. Table 1 shows that for the 166:384 plate height ratio, the deflection plane focus point and perpendicular plane focus point are only 2.6 mm apart, occurring at a position just inside of the exit aperture 460b.

The aspect ratio of the beam cross sections also vary with height ratio. The 166:384 to 169:384 ratios that place the focus points closest together also maintain the beam width and height, keeping them nearly the same as each other, resulting in an aspect ratio of about 1.06, as listed in Table 1.

Comparison with Spherical Electrodes.

A spherical deflector was also simulated using SIMION, for comparison. The concentric spherical electrodes were

TABLE 1

Plate ratio and focus point location data

| Plate Ratio | ±Voltage that turns the beam 90° | Position Along z-axis | | Focus Points Position Difference (mm) | Inner Plate Height (mm) | Final Aspect Ratio |
| --- | --- | --- | --- | --- | --- | --- |
| | | Deflection Plane Focus (mm) | Perpendicular Plane Focus (mm) | | | |
| 192:384 | 2469.91 | 221.8 | 293.0 | −71.2 | 51 | 1.62 |
| 170:384 | 2482.64 | 244.2 | 255.8 | −11.6 | 45 | 1.11 |
| 169:384 | 2485.28 | 247.9 | 250.5 | −2.6 | 44 | 1.06 |
| 168:384 | 2485.28 | 247.9 | 250.5 | −2.6 | 44 | 1.06 |
| 167:384 | 2485.28 | 247.9 | 250.5 | −2.6 | 44 | 1.06 |
| 166:384 | 2485.28 | 247.9 | 250.5 | −2.6 | 44 | 1.06 |
| 165:384 | 2488.21 | 254.6 | 245.2 | 9.4 | 43 | 0.98 |
| 164:384 | 2488.21 | 254.6 | 245.2 | 9.4 | 43 | 0.98 |
| 128:384 | 2525.40 | 348.9 | 207.1 | 141.8 | 34 | 0.45 |

FIG. 5 is a graph 500 that illustrates dependence of beam focus position on electrode plate height ratio, according to various embodiments. The horizontal axis 502 represents the simulation height of the inner plate, in arbitrary units, relative to a fixed height of 384 units for the outer plate. The vertical axis 504 represents the Z coordinate value (in millimeters) along the output beam of the point of minimum beam cross section (called the focus point) in one plane. The triangles 510 represent the focus points in the deflection plane, and the circles 520 represent the focus points in the perpendicular plane that includes the output beam.

The focus point in the deflection plane decreases its Z coordinate (axis 504) with increasing inner plate height (axis 502). Conversely, the focus point in the perpendicular plane increases its Z coordinate with increasing inner plate height. The span of plate ratios yielding substantively the same results is due to the resolution of the simulation. For some different values of the ratio, the "inner plate height" column in given the same curvature radii as the cylindrical electrodes. The focus point locations and aspect ratios for the 166:384 height ratio cylindrical deflector and a spherical deflector (not shown) were similar.

Another way in which to evaluate the ability of the cylindrical deflector to replace a spherical deflector is to look at the potentials of the two deflectors in comparison to each other. Each deflector's electrode plates were set at voltages of ±2485.28 V, taken from the optimal model voltages for the embodiment described in Table I, above.

Figure 6A:
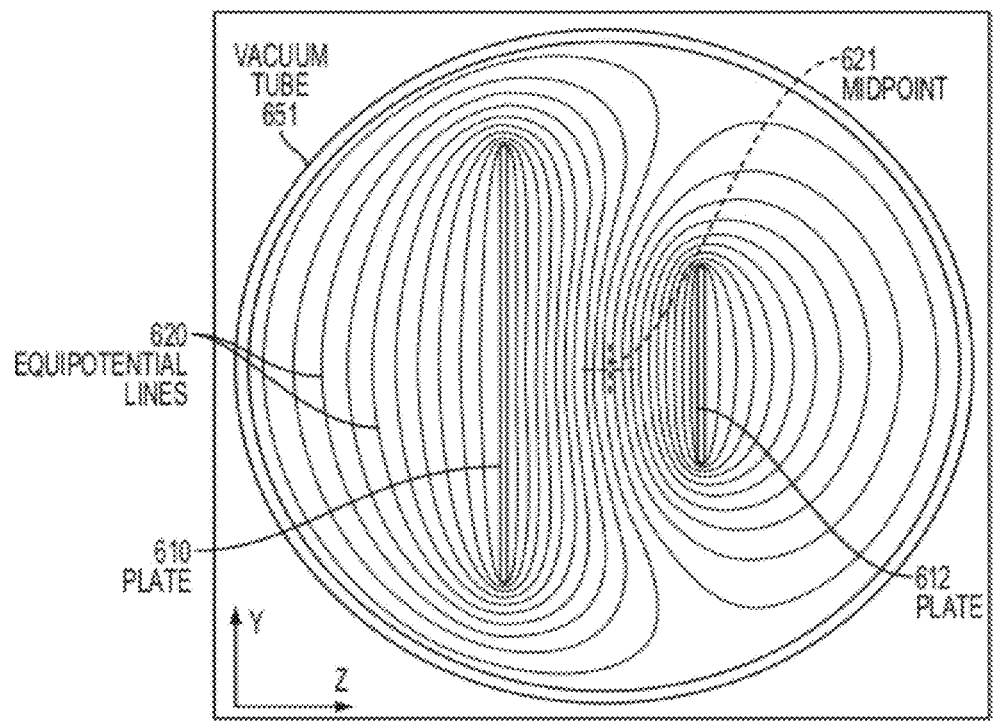
FIG. 6A is a diagram that illustrates a vertical cross section of equipotential lines for cylindrical plates of different heights, according to an embodiment.

FIG. 6A is a diagram that illustrates a vertical cross section of equipotential lines for cylindrical plates of different heights, according to an embodiment. The vertical plane of this cross section includes the center of curvature of one or both cylindrical plates. The vacuum tube 651 is at zero voltage and surrounds cylindrical plate 610 and cylindrical plate 612 at different non zero voltages. Lines of equal electrical potential (equipotential lines) 620 are depicted. The equipotential lines are presented in a range from +2250 V to −2250 V; and the voltage difference (ΔV) between adjacent equipotential lines is 250 V. Of particular interest is the shape and separation of equipotential lines in the vicinity of a midpoint 621 between plates 610 and 612, where a beam traverses the vacuum tube.

Figure 6B:
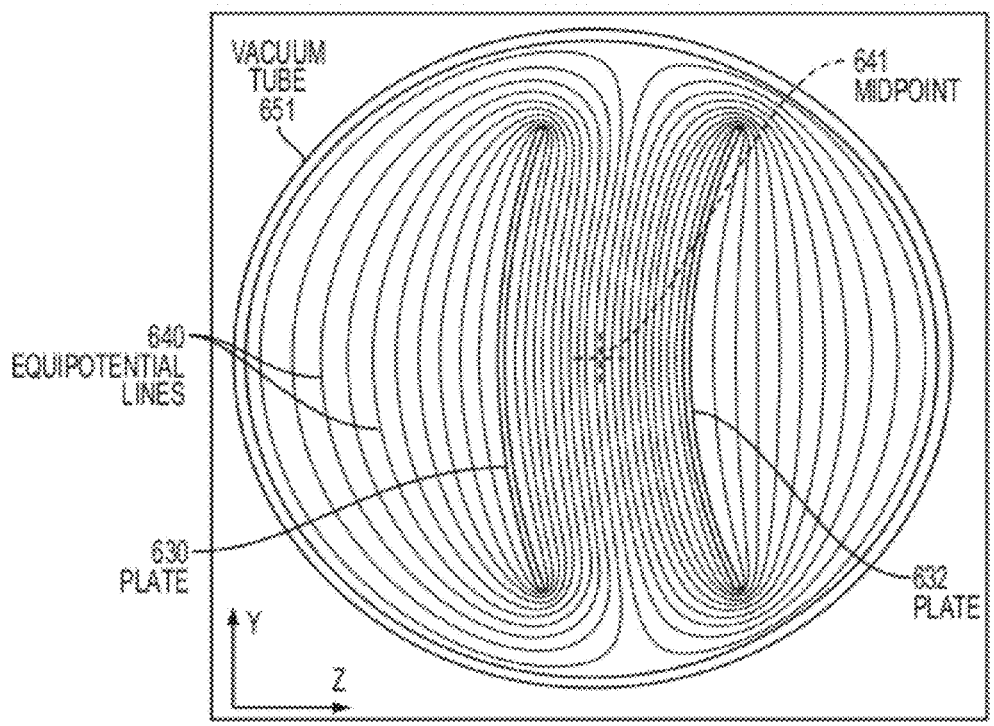
FIG. 6B is a diagram that illustrates a vertical cross section of equipotential lines for spherical plates.

FIG. 6B is a diagram that illustrates a vertical cross section of equipotential lines for spherical plates. The vacuum tube 651 is at zero voltage and surrounds spherical plate 630 and spherical plate 632 at different non zero voltages. Equipotential lines 640 are depicted. As above, the equipotential lines are plotted in a range from +2250 V to −2250 V; and the voltage difference (ΔV) between adjacent equipotential lines is 250 V. Of particular interest is the shape and separation of equipotential lines in the vicinity of a midpoint 641 between plates 630 and 632, where a beam traverses the vacuum tube. One can observe that the potentials are nearly identical in the vicinity of the midpoints 621 and 641.

These figures demonstrate that the cylindrical plates of different heights create electric fields near the beam similar to those of a standard spherical deflector, with similar focusing properties in both the deflection plane and the perpendicular plane.

Effects on Horizontal and Vertical Focus by Aperture Differences.

In some embodiments, additional control of horizontal and vertical focus is provided by varying the size or shape or both of apertures in face plates.

Simulations were performed to show how the focus point locations are dependent on aperture size. Three aperture sizes were simulated, comparing the originally designed rectangular aperture (13 mm×34 mm) in Table 1 to a small square (13 mm×13 mm) aperture in Table 2 and to a large square (34 mm×34 mm) aperture in Table 3.

Table 2 shows that for plate height ratios between 153:384 and 157:384 the focus positions for the small square aperture are the closest together at 3.4 mm apart. This occurs just inside the exit aperture. At these plate ratios, the aspect ratio for the beam is 0.91. The data reveals that the focus points would merge to the same Z coordinate somewhere between a height ratio of 157:384 and a height ratio of 158:384, again just inside the exit aperture.

TABLE 2

Small square aperture (13 mm x 13 mm) plate ratio and focus location

| | | Position Along z-axis | | Focus | | |
|---|---|---|---|---|---|---|
| Plate Ratio | ±Voltage that turns the beam 90° | Deflection Plane Focus (mm) | Perpendicular Plane Focus (mm) | Points Position Difference (mm) | Inner Plate Height (mm) | Final Aspect Ratio |
| 167:384 | 2486.32 | 237.0 | 267.1 | −30.1 | 44 | 1.13 |
| 166:384 | 2486.32 | 237.0 | 267.1 | −30.1 | 44 | 1.13 |
| 165:384 | 2489.27 | 242.9 | 261.3 | −18.4 | 43 | 1.04 |
| 163:384 | 2489.27 | 242.9 | 261.3 | −18.4 | 43 | 1.04 |
| 161:384 | 2492.31 | 246.9 | 255.9 | −9.0 | 42 | 0.98 |
| 159:384 | 2492.31 | 246.9 | 255.9 | −9.0 | 42 | 0.98 |
| 158:384 | 2492.31 | 246.9 | 255.9 | −9.0 | 42 | 0.98 |
| 157:384 | 2495.69 | 254.0 | 250.6 | 3.4 | 41 | 0.91 |
| 154:384 | 2495.69 | 254.0 | 250.6 | 3.4 | 41 | 0.91 |

Table 3 shows that for plate height ratios between 162:384 and 165:384, the focus point locations for the large square aperture are the closest together at 4.6 mm apart. These focus points occur on either side of the exit aperture. At these plate ratios, the aspect ratio is 0.87. The data reveals that the focus points would merge somewhere between a height ratio of 165:384 and a height ratio of 166:384, arguably at a position close to the exit aperture.

TABLE 3

Large square aperture (34 mm x 34 mm) plate ratio and foci location data

| | | Position Along z-axis | | Focus | | |
|---|---|---|---|---|---|---|
| Plate Ratio | ±Voltage that turns the beam 90° | Deflection Plane Focus (mm) | Perpendicular Plane Focus (mm) | Points Position Difference (mm) | Inner Plate Height (mm) | Final Aspect Ratio |
| 168:384 | 2434.95 | 250.8 | 259.2 | −8.4 | 44 | 0.94 |
| 167:384 | 2434.95 | 250.8 | 259.2 | −8.4 | 44 | 0.94 |
| 166:384 | 2434.95 | 250.8 | 259.2 | −8.4 | 44 | 0.94 |
| 165:384 | 2436.91 | 258.3 | 253.7 | 4.6 | 43 | 0.87 |
| 164:384 | 2436.91 | 258.3 | 253.7 | 4.6 | 43 | 0.87 |
| 162:384 | 2436.91 | 258.3 | 253.7 | 4.6 | 43 | 0.87 |
| 128:384 | 2466.83 | 377.3 | 213.1 | 164.2 | 34 | 0.32 |

Further simulations were performed to determine effects of a shape of the aperture. Apertures of a constructed device, in some embodiments, have rounded corners (quarter circles with radii of 6.5 mm). In contrast, the previously simulated apertures (for which results are presented in Tables 1 through 3, above) have right angle corners. As seen in Table 4 for rounded corners apertures, the 166:384 to 169:384 plate ratios still retain the smallest focus point location difference and best final aspect ratio. The rounded corners apertures did shift the difference in focus point locations slightly (compared to the rectangular aperture of the same size) from about −2.6 mm to about −3.8 mm—a change of only about +1.2 mm. The final aspect ratio for the rounded aperture remained the same as the rectangular aperture at about 1.06.

TABLE 4

Original aperture size (34 mm × 13 mm) with rounded corners

| | | Position Along z-axis | | Focus | | |
|---|---|---|---|---|---|---|
| Plate Ratio | ±Voltage that turns the beam 90° | Deflection Plane Focus (mm) | Perpendicular Plane Focus (mm) | Points Position Difference (mm) | Inner Plate Height (mm) | Final Aspect Ratio |
| 165:384 | 2488.24 | 254.1 | 245.9 | 8.2 | 43 | 0.98 |
| 166:384 | 2485.31 | 247.4 | 251.2 | −3.8 | 44 | 1.06 |
| 169:384 | 2485.31 | 247.4 | 251.2 | −3.8 | 44 | 1.06 |
| 170:384 | 2482.67 | 243.7 | 256.4 | −12.7 | 45 | 1.12 |

What is shown from the above tables is that for each embodiment with different aperture size there is a plate ratio that will produce a position where both the deflection plane focus point and the vertical plane focus point coincide. For the resolution achieved in this simulation, it is estimated that the 34 mm×13 mm aperture best focuses the ion beam in both the deflection plane and the vertical plane at nearly the same location while maintaining the best beam aspect ratio.

Effects on Horizontal and Vertical Focus by Offsets Between Plates and Apertures.

In some embodiments additional control of horizontal and vertical focus is provided by varying the relative positions of the cylindrical plates and the apertures in the face plates.

The midpoints between the electrode plates used in the above set of embodiments were not centered on the mid-point of the entrance and exit apertures. A new simulation was performed that positioned the electrodes for another set of embodiments so that the midpoints between the electrodes were centered on the aperture mid-points. A distance of 40 mm was maintained between the cylindrical electrode plates. The new radii were $R_1$=145 mm and $R_2$=185 mm. The data gathered from these simulations are found in Table 5.

TABLE 5

Simulation results for electrodes centered on apertures.

| | | Position Along z-axis | | Focus | | |
|---|---|---|---|---|---|---|
| Plate Ratio | ±Voltage that turns the beam 90° | Deflection Plane Focus (mm) | Perpendicular Plane Focus (mm) | Points Position Difference (mm) | Inner Plate Height (mm) | Final Aspect Ratio |
| 174:384 | 2459.93 | 245.34 | 252.64 | −7.3 | 46 | 1.089 |
| 173:384 | 2461.63 | 251.99 | 246.86 | 5.1 | 45 | 0.999 |
| 172:384 | 2461.63 | 251.99 | 246.86 | 5.1 | 45 | 0.999 |
| 171:384 | 2461.63 | 251.99 | 246.86 | 5.1 | 45 | 0.999 |
| 170:384 | 2461.63 | 251.99 | 246.86 | 5.1 | 45 | 0.999 |
| 169:384 | 2463.69 | 256.33 | 241.74 | 14.6 | 44 | 0.936 |
| 168:384 | 2463.69 | 256.33 | 241.74 | 14.6 | 44 | 0.936 |
| 167:384 | 2463.69 | 256.33 | 241.74 | 14.6 | 44 | 0.936 |
| 166:384 | 2463.69 | 256.33 | 241.74 | 14.6 | 44 | 0.936 |
| 165:384 | 2465.71 | 264.66 | 236.43 | 28.2 | 43 | 0.850 |

The Table 5 results reveal that the deflection and perpendicular plane focus points occur closest together for plate height ratios ranging from 170:384 (0.4427) to 173:384 (0.4505). This is shifted from the range 166:384 (0.4323) to 169:384 (0.4401) found for the original plate configuration (Table 1). The new data now imply that the focus points would merge at a plate height ratio between 173:384 and 174:384 (0.4531), still occurring just inside the exit aperture. Table 5 shows that for the 173:384 plate height ratio, the deflection and perpendicular focus points are 5.1 mm apart, occurring at a position just inside of the exit aperture.

The aspect ratio of the beam has also shifted slightly. The plate height ratios of 170:384 to 173:384 for near coincident focus points give an aspect ratio of 0.999. This is an improvement over the aspect ratio of 1.06 found for the height ratio for near coincident focus points of Table 1.

Although the above discussion shows attempts to identify height ratios to provide near coincident focus points, in other embodiments separated focus points are desirable and achieved with different height ratios, such as one or more height ratios listed in one or more Tables 1 to 5.

Separate Control of Horizontal and Vertical Focus by Asymmetric Voltages.

In some embodiments separate control of horizontal and vertical focus is provided by applying asymmetric voltages on the two cylindrical electrodes.

This feature is demonstrated using simulations based on the following configurations of the cylindrical and face plates in which the midpoints between the plates are centered on the apertures in the face plates. The outer radius of the inner electrode R1 (e.g., radius 231) is fixed at 145 mm. The inner radius of the outer electrode R2 (e.g., radius 233) is fixed at 185 mm. The height of the outer electrode (e.g., outer plate 213) is constant at 101 mm; while the height of the inner electrode (e.g., inner plate 211) assumes values of 44, 45, 46, and 47 mm in various simulated embodiments.

The simulated deflector aperture openings 360 are rectangular, 34 mm high (Y dimension) by 13 mm wide (in the Z dimension at the entrance and in the X dimension at the exit as shown in FIG. 3E). The center of the entrance aperture is at a Z coordinate of 85 mm at the entrance aperture and at an X coordinate of 85 mm at the exit aperture. In these simulations, the aperture edges are not rounded as they are in a physical embodiment. As shown above, this difference does not cause a large change in the results. The distance in the X-Z plane between the ends of the electrode plates and the entrance and exit apertures (shown as gap 415 in FIG. 4) is 5.5 mm. The vacuum chamber portion which surrounds the electrodes is tee shaped in the X-Z plane, made of electrically grounded metal cylinders (shown in FIG. 3E) with an inner diameter D of 150 mm (e.g., D 402 shown in the X-Z plane in FIG. 4). The ion beam is the same as used in previous simulations, described above.

For each plate height ratio, asymmetric voltages (V1, V2) that deflect the central ion trajectory by exactly 90 degrees are determined. Here V1 is the inner plate voltage and V2 the outer plate voltage. The central ion starts at Y=0 mm and Z=85 mm and flies along in the negative X direction at the entrance aperture. When the central ion exits the exit aperture at Y=0 mm and X=85 mm, the ion is flying in the positive Z direction and the ion has made a 90 degree turn.

Using the 90 degree deflection voltages determined in this way, the positions of the deflection plane and perpendicular plane focus points are determined by using particles flown in the horizontal and vertical planes, respectively. The ions in both the deflection plane and the perpendicular plane are simulated at the same time to determine the aspect ratio of the beam cross section. The cross section aspect ratio is defined as the ratio of the distance across all ions in the deflection plane (width) divided by the distance across all ions in the perpendicular plane (height). This ratio is determined where the ions reach the end of the workbench at Z=600 mm.

The simulation results are shown for inner plate heights of 44 mm, 45 mm, 46 mm and 47 mm in Table 6, Table 7, Table 8 and Table 9, respectively. These correspond to plate height ratios of 44:101 (0.4356), 45:101 (0.4455), 46:101 (0.4554), and 47:101 (0.4653) respectively, near the preferred height ratios determined above for coincident focus points.

TABLE 6

Effects of asymmetric voltages for plate height ratio of 44:101.

| | | Position along z-axis | | | |
|---|---|---|---|---|---|
| Plate 1 Voltage (V) | Plate 2 Voltage (V) | Z coordinate Dispersion Plane focus (mm) | Z coordinate Perpendicular plane focus (mm) | Focus Points separation (mm) | Aspect ratio |
| 2315 | −2554.55 | 248.47 | 249.11 | −0.65 | 1.05 |
| 2320 | −2551.49 | 248.72 | 248.85 | −0.13 | 1.04 |
| 2325 | −2548.44 | 248.98 | 248.59 | 0.39 | 1.04 |
| 2360 | −2527.06 | 250.79 | 246.79 | 3.99 | 1.01 |
| 2400 | −2502.62 | 252.89 | 244.79 | 8.10 | 0.98 |
| 2463.69 | −2463.69 | 256.33 | 241.74 | 14.59 | 0.94 |

TABLE 7

Effects of asymmetric voltages for plate height ratio of 45:101.

| | | Position along z-axis | | | |
|---|---|---|---|---|---|
| Plate 1 Voltage (V) | Plate 2 Voltage (V) | Z coordinate Dispersion Plane focus (mm) | Z coordinate Perpendicular plane focus (mm) | Focus Points separation (mm) | Aspect ratio |
| 2400 | −2499.34 | 248.89 | 249.95 | −1.05 | 1.05 |
| 2410 | −2493.22 | 249.39 | 249.43 | −0.04 | 1.04 |
| 2412.5 | −2491.69 | 249.52 | 249.31 | 0.21 | 1.04 |
| 2415 | −2490.16 | 249.64 | 249.18 | 0.46 | 1.03 |
| 2461.63 | −2461.63 | 251.99 | 246.86 | 5.14 | 1.00 |
| 2500 | −2438.14 | 253.97 | 245.01 | 8.96 | 0.97 |
| 2550 | −2407.53 | 256.59 | 242.67 | 13.92 | 0.94 |

TABLE 8

Effects of asymmetric voltages for plate height ratio of 46:101.

| | | Position along z-axis | | | |
|---|---|---|---|---|---|
| Plate 1 Voltage (V) | Plate 2 Voltage (V) | Z coordinate Dispersion Plane focus (mm) | Z coordinate Perpendicular plane focus (mm) | Focus Points separation (mm) | Aspect ratio |
| 2459.93 | −2459.93 | 245.34 | 252.64 | −7.29 | 1.09 |
| 2500 | −2435.38 | 247.19 | 250.61 | −3.42 | 1.06 |
| 2530 | −2416.99 | 248.58 | 249.13 | −0.55 | 1.04 |
| 2535 | −2413.93 | 248.82 | 248.89 | −0.07 | 1.03 |
| 2540 | −2410.87 | 249.06 | 248.65 | 0.40 | 1.03 |
| 2550 | −2404.74 | 249.53 | 248.17 | 1.37 | 1.02 |

TABLE 9

Effects of asymmetric voltages for plate height ratio of 47:101.

| | | Position along z-axis | | | |
|---|---|---|---|---|---|
| Plate 1 Voltage (V) | Plate 2 Voltage (V) | Z coordinate Dispersion Plane focus (mm) | Z coordinate Perpendicular plane focus (mm) | Focus Points separation (mm) | Aspect ratio |
| 2458.19 | −2458.19 | 241.72 | 258.08 | −16.36 | 1.16 |
| 2465 | −2454.01 | 242.01 | 257.72 | −15.70 | 1.15 |
| 2470 | −2450.94 | 242.22 | 257.45 | −15.22 | 1.15 |
| 2480 | −2444.81 | 242.66 | 256.92 | −14.26 | 1.14 |
| 2500 | −2432.54 | 243.52 | 255.87 | −12.34 | 1.12 |
| 2550 | −2401.88 | 245.72 | 253.32 | −7.60 | 1.09 |
| 2600 | −2371.20 | 247.96 | 250.86 | −2.91 | 1.05 |
| 2625 | −2355.86 | 249.05 | 249.67 | −0.62 | 1.03 |
| 2627.5 | −2354.32 | 249.17 | 249.55 | −0.39 | 1.03 |
| 2630 | −2352.79 | 249.29 | 249.44 | −0.15 | 1.03 |
| 2632.5 | −2351.26 | 249.43 | 249.32 | 0.11 | 1.02 |
| 2635 | −2349.72 | 249.55 | 249.20 | 0.35 | 1.02 |
| 2640 | −2346.65 | 249.77 | 248.97 | 0.81 | 1.02 |
| 2650 | −2340.52 | 250.24 | 248.50 | 1.74 | 1.01 |

Tables 6 to 9 show that asymmetric pairs of voltages can be determined that produce focus points lying close together. For a plate height ratio of 44:101 (Table 6) it is found that the focus points should be substantively coincident (also called co-spatial) for V1, V2 value pairs between (2320 V, −2551.49 V) and (2325 V, −2548.44 V). For a height ratio of 45:101 (Table 7) the focus points are substantively coincident between (2410 V, −2493.22V) and (2412.5 V, −2491.69V). For a height ratio of 46:101 (Table 8) the focus points are substantively coincident between (2535 V, −2413.93 V) and (2540 V, −2410.87 V). Lastly, for a height ratio 47:101 ratio (Table 9) the focus points are substantively coincident somewhere between (2630 V, −2352.79 V) and (2632.5 V, −2351.26 V).

In Tables 6 to 9 it is further evident that the voltage value V1 which causes the focus points to lie closest together increases with the height of the inner plate. The corresponding voltage for V2 decreases. Conversely, when the inner plate height is reduced, the V1 value which brings the focus points to occur closest together decreases whereas the appropriate V2 value increases.

These embodiments with asymmetric voltages have also been compared to the embodiments with symmetric voltages. In an ideal case, the deflection should depend only on the electric field E between the plates. To first order E=(V1−V2)/d where d is the distance between the plates. In Table 10 are given the approximate values of ΔV=V1−V2 found to deflect the beam 90 degrees for a range of height ratios for both the symmetric and asymmetric cases. Also listed are the respective aspect ratios of the beam cross section at Z=600 mm. The values of the symmetric and asymmetric voltages to deflect the beam 90 degrees are retrieved from Tables 6 to 9. The value of the symmetric voltage difference is double of this absolute value. The approximate value of the asymmetric voltage difference in Table 10 is roughly the average difference of the two voltage pairs bracketing a focus point separation of 0 mm. The beam cross section aspect ratio for the asymmetric case is roughly the average of the corresponding aspect ratios for these same two pairs of voltages bracketing the focus point separation of 0 mm.

TABLE 10

Comparison of voltage differences to deflect ion beam 90 degrees and produce near co-spatial focus points.

| Plate height ratio | Symmetric | | Asymmetric | |
|---|---|---|---|---|
| | ΔV (V) | Aspect ratio | ΔV (V) | Aspect ratio |
| 44:101 | 4927 | 0.94 | 4872 | 1.04 |
| 45:101 | 4923 | 1.00 | 4904 | 1.04 |
| 46:101 | 4920 | 1.09 | 4950 | 1.03 |
| 47:101 | 4916 | 1.16 | 4983 | 1.03 |

Table 10 shows that the voltage differences for the asymmetric voltage embodiments are different from those for symmetric voltage embodiments. This can be explained by the re-referencing of the kinetic energy that the ions experience when they enter the deflector. Since the voltages applied to the plates are no longer centered around zero, the ions will be decelerated upon entrance and accelerated upon exit.

For example, for an experimental embodiment described in the next section, a plate height ratio is 45:101 with an inner plate radius R1 (e.g., radius 231) of 140 mm and outer plate radius R2 (e.g., radius 232) of 178 mm (different from the simulations of Table 10), the asymmetric voltages are −3000V on the outer electrode and +1620 on the inner electrode to obtain a 90 degree deflection. In this embodiment, the incoming negatively charged ions loose ½(−3000+1620) V=−725 V of kinetic energy tangential to their flight path, after passing the grounded entrance aperture. The remaining kinetic energy amounts to 9275 eV and, according to Eq. 3, a voltage difference of 4660 eV is expected. The voltage needed to deflect the beam by 90 degrees in the simulation is somewhat lower. This is to be contrasted to the case of symmetric voltage embodiments where the voltages were slightly higher than predicted by Eq. 3.

Table 10 also shows that the symmetric voltage difference for 90 degree deflection and near coincident focus points decreases with increasing inner plate height. Conversely, the asymmetric voltage difference increases with increasing inner plate height.

Table 10 also shows that for the 90 degree deflection voltage in the symmetric case, the beam cross section aspect ratio is a function of the plate height ratio. The aspect ratio increases with increasing plate height ratio. This is to be contrasted with the asymmetric case for which an aspect ratio approaching 1 is achievable for all plate height ratios tested. These results suggest an aspect ratio near 1 is possible for all plate height ratios in asymmetric voltage embodiments. Clearly the asymmetric embodiments provide greater flexibility to control the deflected ion beam properties than do the symmetric embodiments. Thus asymmetric voltages can be used to achieve co-spatial focus points in both the deflection (X-Z) plane and perpendicular (Y-Z) plane for a wide variety of impinging ion beams when there is a fixed height ratio, e.g., in a single physical embodiment.

Experimental Embodiments

Measurements of ion beam deflection were performed with an experimental physical embodiment. In principle, it is possible to shift the focus in the deflection plane as well as orthogonal to it by changing the electrode plate height ratio and the geometry of the entrance and exit electrodes. However, practical limitations for the size of the deflector, the opening apertures for the ion beam, and the vacuum chamber housing have to be taken into account. Moreover, the optical properties can be adjusted in a much more flexible fashion when asymmetric voltages are used.

In a first experimental embodiment, an ion beam deflector comprises a cylindrical deflector with different plate heights (45 mm height for the inner electrode, and 101 mm height for the outer electrode). The deflector was designed to fit into a standard DN160 Conflat vacuum chamber. An inner plate radius R1 (e.g., radius 231) of 140 mm and outer plate radius R2 (e.g., radius 232) of 178 mm were used, as in a conventional cylindrical deflector. The smaller plate height for the inner electrode has three immediately observable effects on the ion trajectories. (1) The net field strength between the plates is weakened and hence slightly higher voltages (+/− 2470 V as compared to +/−2420 V from Eq. 3) are needed to guide the ion beam. (2) The focus point in the dispersion plane occurs at a larger Z coordinate value, it is shifted to about 5 mm before the exit face plate 201. (3) In the Y dimension, the ion beam is no longer unaffected; instead, a narrow beam waist (focus point) forms in the vertical plane about 3 mm after the exit aperture (e.g., 203b). An incoming circular beam of 6 mm diameter at the entrance aperture (e.g., 203a) is compressed to about 0.6 mm extent in the X dimension and about 0.4 mm extent in the Y dimension at the position of the exit aperture (e.g., 203b).

FIG. 7 is a graph 700 that illustrates ion beam cross section shape differences between input and output ion beams for an ion deflector, according to an embodiment. This embodiment is configured according to the first experimental embodiment, described above. The horizontal axis 702 is the Z coordinate at an entrance aperture 360a for ions 710 in an input ion beam; or the X coordinate for ions 720 in a simulated output ion beam. The vertical axis 704 is the Y coordinate value for ions 710, 720 in either beam. The ions 710 of the simulated input ion beam are at the outer edge of a 6 mm diameter circular ion beam at the entrance aperture 360a. The ions 720 of the simulated output ion beam are at the outer edge of the output ion beam at a position 150 mm beyond the exit aperture (e.g., beyond 203b). Note that the incoming beam is parallel while the outgoing beam is divergent. Thus, while the beam cross section are about the same size at a position 150 mm beyond the exit aperture, at the exit aperture (e.g., 203b) the simulated output ion beam is compressed to about 0.6 mm extent in the X dimension and about 0.4 mm extent in the Y dimension.

Figure 8A:
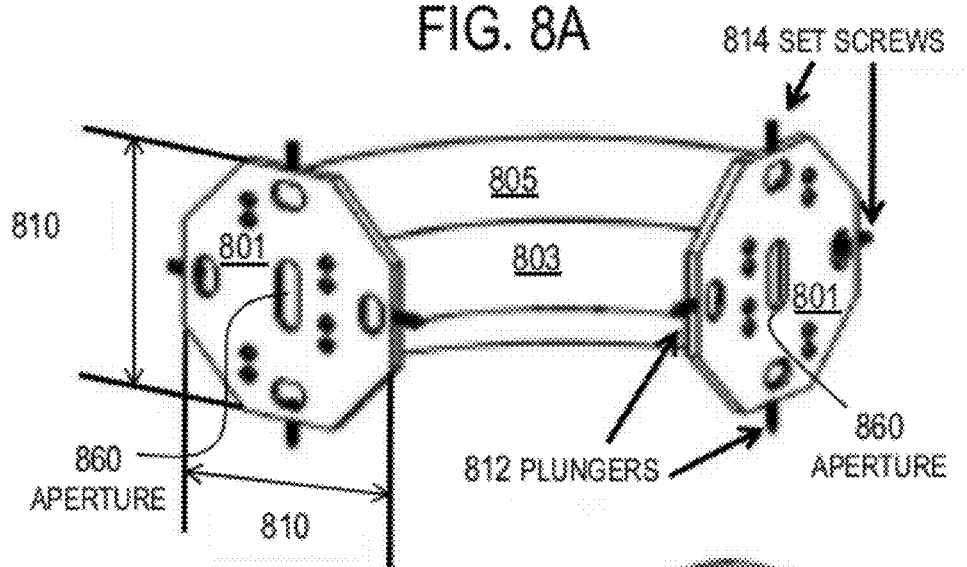
FIG. 8A and FIG. 8B are drawings that illustrate a constructed ion deflector, according to another embodiment.
Figure 8B:
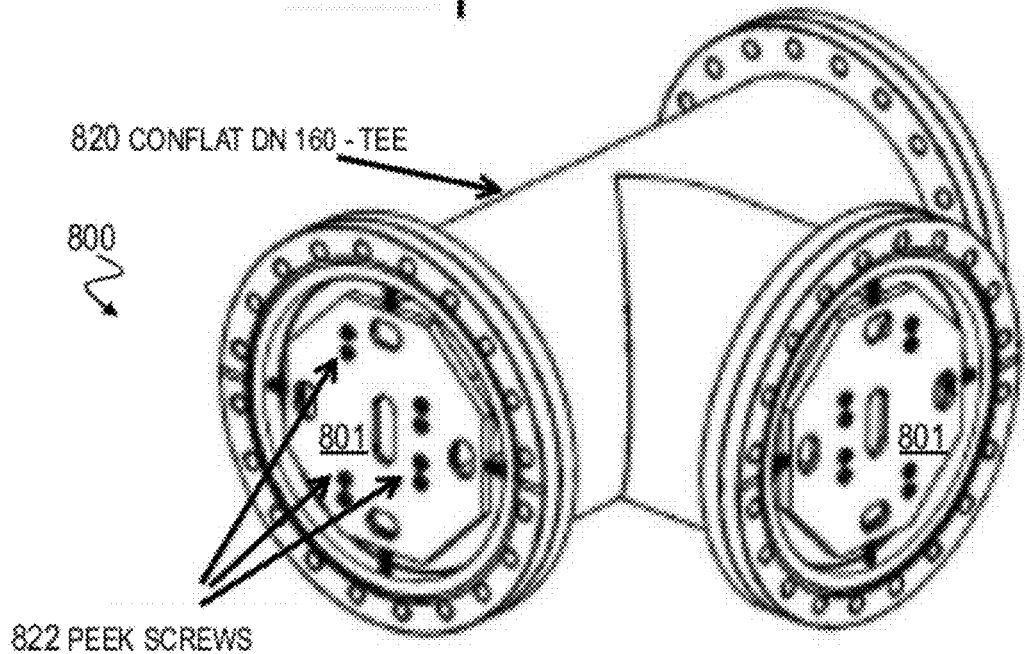

Following the above detailed simulations and experimental embodiment, a second experimental embodiment of the deflector was built with a plate height ratio of 101 mm to 45 mm. FIG. 8A and FIG. 8B are drawings that illustrate a constructed ion deflector 800, according to the second experimental embodiment. FIG. 8A shows the face plates 801 of diameter 810 equal to 150 mm, and inner cylindrical plate 803 that is 45 mm high and outer cylindrical plate 805 that is 101 mm high. The inner plate 803 has a radius of curvature R1 of 140 mm; and the outer plate 805 has a radius of curvature R2 of 178 mm. The face plates 801 each include two plungers 812 and two set screws 814, as described below. Each face plate 801 includes an aperture 860 that is 35 mm high and 12.7 mm wide with rounded corners. FIG. 8B shows the face plates 801 positioned on a conflate DN 160-Tee vacuum tube. Each end of cylindrical plates 803 and 805 are attached to a face plate 801 by a pair of PEEK screws 822, as described below.

The cylindrical plates 803 and 805 were manually rolled from flat stainless steel sheet metal. They were held by two stainless face plates 801 with rounded rectangular apertures 830. The mechanical connection between the face plates 801 and the cylindrical plates 803 and 805 was provided by small aluminum blocks that were fixed to the face plates 801 with PEEK screws 822 and ceramic tubes for electrical isolation. The face plates 801 were clamped into the vacuum tube 820 utilizing set screws 814 and nose-plungers 812 for ease of adjustment. The voltages are fed into the vacuum tube 820 by SHV-5 feed through leads welded into the vacuum chamber walls and connected to the backsides of an opposing pair of the aluminum connector blocks. All materials were chosen to be ultra-high vacuum compatible. Without special precautions, the ion deflector 800 can be operated with voltages up to about 5500 V allowing for the deflection of ion beams with energies of about 20 keV. Extending this range to higher energies would be possible with simple modifications easily determined by those of ordinary skill in the art.

In order to verify the SIMION simulations, ion beam cross sections were measured for an input beam comprising a collimated H− ion beam at 10 keV. The ion beam was created in a duoplasmatron ion source and shaped by two 5 mm circular apertures, approximately 5 m apart. The result is a uniformly filled circular ion beam of 5 mm diameter with negligible divergence (about 1 milliradian, mrad, 1 mrad=$10^{-3}$ radians).

Figure 9:
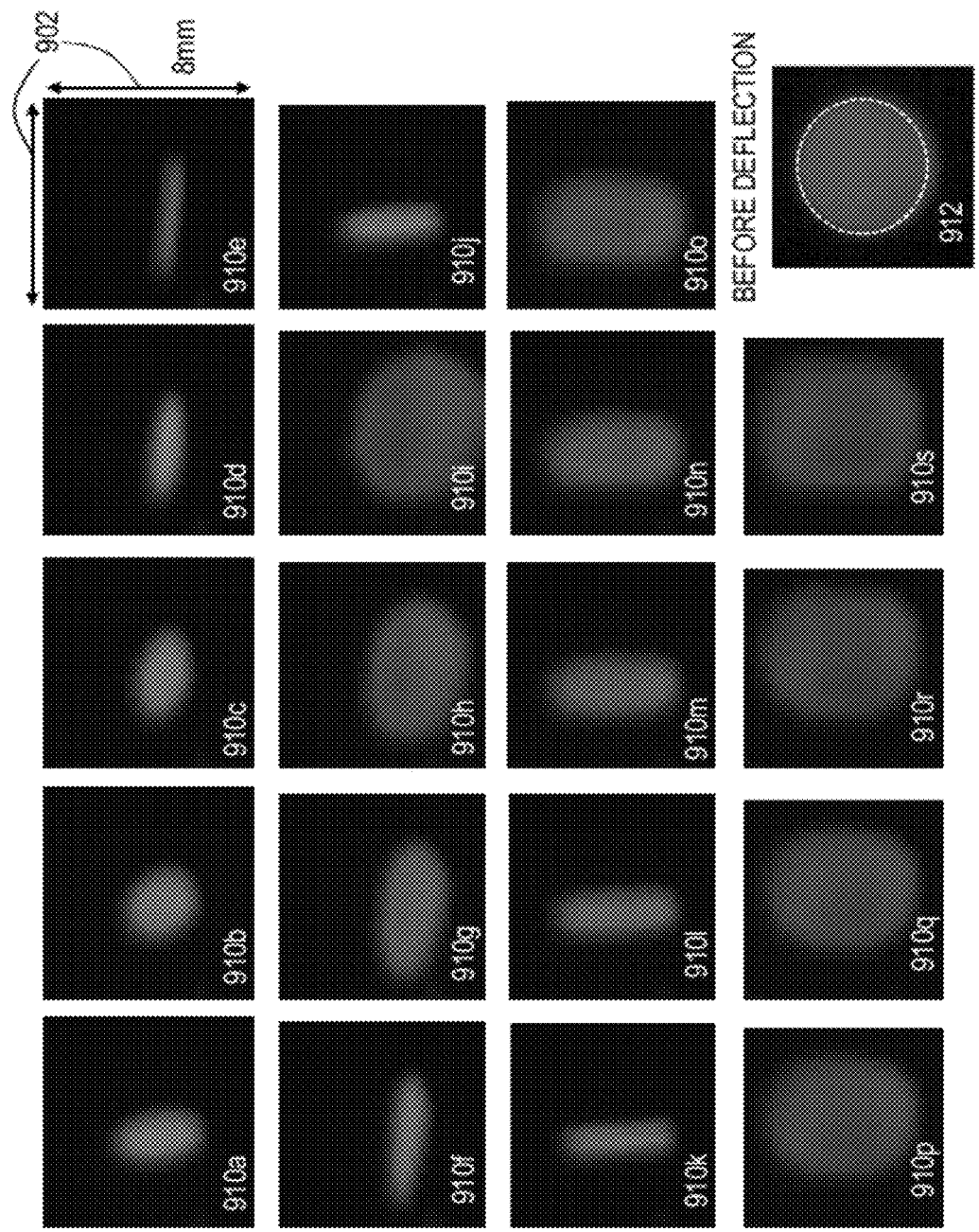
FIG. 9 is an array of images showing measured ion beam cross sections from the ion deflector of FIG. 8A and FIG. 8B, according to various embodiments.

FIG. 9 is an array of images showing ion beam cross sections measured from the ion deflector of FIG. 8A and FIG. 8B, according to various embodiments. The array includes images 910a through image 910s and image 912, collectively referenced hereinafter as images 910. Each image 910 is recorded with a High Resolution Beam Imaging System (HR-BIS) from BEAM IMAGING SOLUTIONS INC™ of Longmont, Colo. based on a Micro Channel Plate (MCP) and a phosphor screen. The horizontal and vertical scale of the images 910 are given by arrows 902 representing 8 mm. In each embodiment, the input ion beam is a circular cross section ion beam represented by the outlined light area of image 912, labeled "before deflection." Each embodiment indicates a different pair of voltages that deflect the input beam 90 degrees, as listed in Table 11.

TABLE 11

Voltage pairs associated with ion beam cross section images.

| Image | Outer Plate voltage V2 (V) | Inner Plate voltage V1 (V) |
|---|---|---|
| 910a | −2560 | +2560 |
| 910b | −2760 | +2260 |
| 910c | −2960 | +1950 |
| 910d | −3160 | +1640 |
| 910e | −3360 | +1340 |
| 910f | −3560 | +1180 |
| 910g | −3760 | +720 |
| 910h | −3960 | +400 |
| 910i | −4160 | +100 |
| 910j | −2460 | +2730 |
| 910k | −2260 | +3030 |
| 910l | −2060 | +3330 |
| 910m | −1860 | +3650 |
| 910n | −1660 | +3950 |
| 910o | −1460 | +4260 |
| 910p | −1260 | +4560 |
| 910q | −1060 | +4870 |
| 910r | −960 | +5180 |
| 910s | −660 | +5470 |

An input ion beam was sent through the two 5 mm apertures before injection into the deflector, producing a collimated beam with a uniformly filled circular cross section (image 912). The voltages for the outer/inner cylindrical plates are given in the insets and Table 11. The MCP imaging detector was located about 44 mm beyond the deflector exit aperture. The ion beam cross sections in the lowest row (images 910o to 910s) may be cropped at the sides, due to a damaged region of the detector.

As shown in FIG. 9, the effect that asymmetric voltages have on the position of the focus points is clearly visible as the beam shape measured in the deflection plane varies from circular patterns to horizontally and vertically oblong shapes. For most of the images 910, the beam profile displays a diagonal distortion. This effect is attributed to the imperfect alignment of the deflector inside the vacuum chamber. The deflector 800 was constructed for simplicity rather than precision. Test measurements after dismantling and assembling the deflector 800 several times (an operation that can be completed within 30 minutes) revealed that the distance between the electrodes can vary by up to 2 mm, despite proper placement of the face plates. This lack of precision is attributed to the use of flexible sheet metal and PEEK screws, and can be easily improved for applications demanding higher accuracy The ability to manipulate the beam profile by applying asymmetric potentials can be a distinct advantage when working with ion beams that are not necessarily perfectly circular. In some embodiments, the deflector with asymmetric heights and voltages not only serves to bend the beam at a right angle, it also acts as an ion optical element, controlling the beam shape for particular applications.

ALTERNATIVES AND MODIFICATIONS

Some embodiments of an electrostatic double-focusing 90 degree deflector for fast ion beams have been described, consisting of concentric cylindrical plates. In contrast to standard cylindrical deflectors, these embodiments allow for focusing of an incoming parallel beam in the plane of deflection as well as in the orthogonal direction. The optical properties of these embodiments resemble those of a spherical capacitor deflector; yet these embodiments are much easier and more cost-effective to manufacture. Furthermore, the electric potentials needed for beam deflection are much lower than for a quadrupole deflector at the same beam energy. Alterations to work with higher beam energies and to minimize aberrations and to achieve particular beam shape effects and differing deflection angles are anticipated.

While embodiments have been described in connection with a number of implementations, the invention is not so limited but covers various obvious modifications and equivalent arrangements, which fall within the purview of the appended claims. Although features of the invention are expressed in certain combinations among the claims, it is contemplated that these features can be arranged in any combination and order.

What is claimed is:

1. An ion deflector for deflecting a beam of charged particles along a beam path, the ion deflector comprising a pair of non-spherical deflection electrodes adapted for being charged with different voltages, wherein the pair of deflection electrodes are configured to control a two dimensional cross sectional spread of charged particles in a deflected beam that exits the ion deflector, wherein the pair of deflection electrodes are configured to substantively make parallel an incident beam focused in two dimensions at a focal point reached before leaving the ion deflector.

2. An ion deflector for deflecting a beam of charged particles along a beam path, the ion deflector comprising a pair of non-spherical deflection electrodes adapted for being charged with different voltages, wherein the pair of deflection electrodes are configured to control a two dimensional cross sectional spread of charged particles in a deflected beam that exits the ion deflector, wherein:
    a first electrode of the pair of deflection electrodes is a curved plate parallel to the beam path and having a first height perpendicular to the beam path;
    a second electrode of the pair of electrodes is a curved plate parallel to the first electrode and having a second height perpendicular to the beam path; and
    the second height is different from the first height.

3. An ion deflector as recited in claim 2, wherein the pair of electrodes comprises corresponding portions of two concentric cylindrical plates.

4. An ion deflector as recited in claim 2, wherein the first electrode is adapted to be charged to attract charged particles in the beam and the second height is substantively greater than the first height.

5. An ion deflector as recited in claim 2, wherein control of the cross sectional spread in the direction perpendicular to the beam path is based on a difference between the second height and the first height.

6. An ion deflector as recited in claim 2, wherein the second height is about double the first height.

7. An ion deflector as recited in claim 2, wherein control of the cross sectional spread in a direction perpendicular to the beam path is based on a separation distance between the pair of electrodes.

8. An ion deflector as recited in claim 2, wherein a separation distance between the pair of electrodes is about equal to the first height.

9. An apparatus comprising:
    a vacuum chamber portion;
    a first cylindrical plate having a first radius of curvature and a first height; and
    a second cylindrical plate having a different second radius of curvature and a different second height,
    wherein
        the first cylindrical plate is disposed inside the vacuum chamber portion,
        the second cylindrical plate is disposed inside the vacuum chamber portion and disposed parallel to the first cylindrical plate,
        the first cylindrical plate and second cylindrical plate are configured to hold different voltages sufficient to deflect an ion beam along a beam path that curves parallel to the first cylindrical plate and the second cylindrical plate, and
        a ratio of the first height to the second height is configured to cause the ion beam to be focused in two dimensions after the ion beam is deflected.

10. An apparatus as recited in claim 9, wherein the ratio of the first height to the second height is configured to cause a first position where the ion beam is focused in a first dimension to be substantively coincident with a second position where the ion beam is focused in a dimension perpendicular to the first dimension.

11. A method of operating an apparatus comprising a vacuum chamber portion, and a first cylindrical plate having a first radius of curvature and a first height, and a second cylindrical plate having a different second radius of curvature and a different second height, wherein the first cylindrical plate is disposed inside the vacuum chamber portion and the second cylindrical plate is disposed inside the vacuum chamber portion and disposed parallel to the first cylindrical plate, the method comprising applying different voltages to the first cylindrical plate and the second cylindrical plate sufficient to deflect an ion beam along a beam path that curves parallel to the first cylindrical plate and the second cylindrical plate and to focus the ion beam in two dimensions after the ion beam is deflected.

12. A method as recited in claim 11, further comprising determining the different voltages to cause a first position where the ion beam is focused in a first dimension to be substantively coincident with a second position where the ion beam is focused in a dimension perpendicular to the first dimension.

13. A method as recited in claim 11, wherein the different voltages are not symmetric about zero voltage.

14. A method as recited in claim 11, further comprising determining the different voltages to cause a cross section shape of the ion beam after the ion beam is deflected to be substantively equal to a cross section shape of the ion beam before the beam is deflected.

\* \* \* \* \*